(12) United States Patent
Lau et al.

(10) Patent No.: US 9,572,269 B2
(45) Date of Patent: Feb. 14, 2017

(54) SUPPORT SYSTEM

(71) Applicants: Alex Lau, London (GB); Andrew Wills, London (GB)

(72) Inventors: Alex Lau, London (GB); Andrew Wills, London (GB)

(73) Assignee: Colebrook Bosson Saunders (Products) Limited, London (GB)

( * ) Notice: Subject to any disclaimer, the term of this patent is extended or adjusted under 35 U.S.C. 154(b) by 0 days.

(21) Appl. No.: 14/792,318

(22) Filed: Jul. 6, 2015

(65) Prior Publication Data

US 2016/0037663 A1    Feb. 4, 2016

Related U.S. Application Data

(60) Division of application No. 13/702,180, filed as application No. PCT/GB2011/000874 on Jun. 9, 2011, (Continued)

(30) Foreign Application Priority Data

Jun. 9, 2010  (GB) .................................. 1009680.8

(51) Int. Cl.
*F16M 11/12*     (2006.01)
*H05K 5/02*      (2006.01)
(Continued)

(52) U.S. Cl.
CPC ............... *H05K 5/0204* (2013.01); *F16B 7/10* (2013.01); *F16C 11/04* (2013.01); *F16M 11/126* (2013.01);
(Continued)

(58) Field of Classification Search
None
See application file for complete search history.

(56) References Cited

U.S. PATENT DOCUMENTS

| 406,534 A | 7/1889 | Perkins |
| 1,078,577 A | 11/1913 | Fox |

(Continued)

FOREIGN PATENT DOCUMENTS

| CZ | 1666 U1 | 5/1994 |
| DE | 10013445 A1 | 10/2000 |

(Continued)

OTHER PUBLICATIONS

Partial International Search Report for Internationl Application No. PCT/GB2011/000874, dated Oct. 31, 2011 (2 pages).

(Continued)

*Primary Examiner* — Bradley Duckworth
(74) *Attorney, Agent, or Firm* — Michael Best & Friedrich LLP

(57) ABSTRACT

A support arm system for a load such as a display device. The system includes a support arm rotatable at its proximal end about a mid joint axis, monitor supporting head at the distal end of the support arm has an internal slider element and compression spring, and an arrangement of links and pivots which create a torque to oppose the torque created by a load on the head and keep a monitor plate in the same viewing plane relative to the vertical as the arm moves through its range of movement.

15 Claims, 20 Drawing Sheets

Related U.S. Application Data now Pat. No. 9,074,721, which is a continuation-in-part of application No. 13/024,685, filed on Feb. 10, 2011, now Pat. No. 9,316,346.

(51) Int. Cl.

| | |
|---|---|
| *F16M 13/02* | (2006.01) |
| *F16M 11/20* | (2006.01) |
| *F16M 11/24* | (2006.01) |
| *F16B 7/10* | (2006.01) |
| *F16C 11/04* | (2006.01) |

(52) U.S. Cl.
CPC ...... *F16M 11/2064* (2013.01); *F16M 11/2092* (2013.01); *F16M 11/24* (2013.01); *F16M 13/02* (2013.01); *F16M 13/022* (2013.01); *F16M 2200/022* (2013.01); *F16M 2200/041* (2013.01); *F16M 2200/044* (2013.01)

(56) References Cited

U.S. PATENT DOCUMENTS

| | | |
|---|---|---|
| 1,389,700 A | 9/1921 | Rodow |
| 1,719,190 A | 7/1929 | Morgan |
| 1,863,163 A | 4/1931 | Malti et al. |
| 2,562,979 A | 8/1951 | Yingling |
| 2,986,366 A | 5/1961 | Wesson |
| D192,920 S | 5/1962 | Beals |
| 3,199,824 A | 8/1965 | Chapps |
| 3,291,432 A | 12/1966 | Lucasey |
| 3,311,340 A | 3/1967 | Riis |
| 3,358,957 A | 12/1967 | Lindemuth |
| D211,023 S | 5/1968 | Grossman |
| 3,462,112 A | 8/1969 | Vom Brack et al. |
| 3,559,942 A | 2/1971 | Lucasey |
| 3,574,340 A | 4/1971 | Busche |
| 3,662,981 A | 5/1972 | Hogrebe |
| 3,774,873 A | 11/1973 | Krogsrud |
| 3,784,135 A | 1/1974 | Owen, Jr. |
| 3,813,491 A | 5/1974 | Pennar |
| 3,856,251 A | 12/1974 | Miller |
| 3,889,910 A | 6/1975 | Walters |
| 3,950,086 A | 4/1976 | Schulman et al. |
| 3,981,340 A | 9/1976 | Anderson et al. |
| 4,025,017 A | 5/1977 | Miller |
| 4,082,244 A | 4/1978 | Groff |
| 4,160,536 A | 7/1979 | Krogsrud |
| 4,226,390 A | 10/1980 | Steggall |
| 4,298,893 A | 11/1981 | Holmes |
| 4,310,136 A | 1/1982 | Mooney |
| 4,366,741 A | 1/1983 | Titus |
| 4,437,638 A | 3/1984 | Scheibenpflug |
| 4,438,458 A | 3/1984 | Munscher |
| 4,447,031 A | 5/1984 | Souder, Jr. et al. |
| D275,284 S | 8/1984 | Wells et al. |
| 4,487,389 A | 12/1984 | Ziegler |
| 4,516,751 A | 5/1985 | Westbrook |
| 4,546,708 A | 10/1985 | Wilburth |
| D281,502 S | 11/1985 | Wheeler |
| 4,562,987 A | 1/1986 | Leeds et al. |
| 4,565,343 A | 1/1986 | Lake, Jr. et al. |
| 4,566,663 A | 1/1986 | Barchus |
| 4,570,892 A | 2/1986 | Czech et al. |
| 4,616,218 A | 10/1986 | Bailey et al. |
| 4,620,808 A | 11/1986 | Kurtin et al. |
| 4,638,969 A | 1/1987 | Brown |
| 4,669,694 A | 6/1987 | Malick |
| 4,682,749 A | 7/1987 | Strater |
| 4,687,167 A | 8/1987 | Skalka et al. |
| 4,691,886 A | 9/1987 | Wendling et al. |
| 4,703,909 A | 11/1987 | Dayton et al. |
| 4,708,312 A | 11/1987 | Rohr |
| 4,725,106 A | 2/1988 | Shields et al. |
| 4,729,533 A | 3/1988 | Hillary et al. |
| 4,735,467 A | 4/1988 | Wolters |
| 4,762,378 A | 8/1988 | Kagami |
| 4,768,744 A | 9/1988 | Leeds et al. |
| 4,779,922 A | 10/1988 | Cooper |
| 4,783,036 A | 11/1988 | Vossoughi |
| 4,817,903 A | 4/1989 | Braehler et al. |
| 4,834,329 A | 5/1989 | Delapp |
| 4,836,486 A | 6/1989 | Vossoughi et al. |
| 4,844,387 A | 7/1989 | Sorgi et al. |
| 4,852,500 A | 8/1989 | Ryburg et al. |
| 4,863,140 A | 9/1989 | Schriner |
| 4,880,270 A | 11/1989 | Cooper |
| 4,915,450 A | 4/1990 | Cooper |
| 4,944,481 A | 7/1990 | Yurchenco et al. |
| 4,953,822 A | 9/1990 | Sharber et al. |
| 4,964,606 A | 10/1990 | Beam et al. |
| 4,986,501 A | 1/1991 | Simon |
| 4,989,813 A | 2/1991 | Kim et al. |
| 4,993,676 A | 2/1991 | Fitts et al. |
| 5,000,608 A | 3/1991 | Schmidt |
| 5,007,608 A | 4/1991 | Carroll, Jr. |
| 5,039,044 A | 8/1991 | Sher |
| 5,064,161 A | 11/1991 | Anderson et al. |
| 5,086,476 A | 2/1992 | Bacus |
| 5,088,676 A | 2/1992 | Orchard et al. |
| 5,092,552 A | 3/1992 | Dayton et al. |
| 5,108,063 A | 4/1992 | Koerber, Sr. et al. |
| 5,122,941 A | 6/1992 | Gross et al. |
| 5,125,610 A | 6/1992 | Queau |
| 5,127,617 A | 7/1992 | Bergetz |
| 5,139,223 A | 8/1992 | Sedighzadeh |
| 5,165,644 A | 11/1992 | Allen |
| 5,177,616 A | 1/1993 | Riday |
| 5,179,447 A | 1/1993 | Lain |
| 5,187,641 A | 2/1993 | Muskatello et al. |
| 5,195,709 A | 3/1993 | Yasushi |
| D337,333 S | 7/1993 | Turk |
| D340,235 S | 10/1993 | Robak et al. |
| 5,340,072 A | 8/1994 | Halbirt |
| 5,348,260 A | 9/1994 | Acevedo |
| 5,374,104 A | 12/1994 | Moore et al. |
| 5,501,420 A | 3/1996 | Watt et al. |
| 5,537,290 A | 7/1996 | Brown et al. |
| 5,646,818 A | 7/1997 | Hahn |
| 5,667,179 A | 9/1997 | Rosen |
| 5,673,170 A | 9/1997 | Register |
| 5,687,939 A | 11/1997 | Moscovitch |
| 5,791,609 A | 8/1998 | Hankins |
| 5,805,415 A | 9/1998 | Tran et al. |
| 5,826,846 A | 10/1998 | Buccieri et al. |
| 5,842,672 A | 12/1998 | Sweere et al. |
| 5,884,880 A | 3/1999 | Rice |
| 5,904,328 A | 5/1999 | Leveridge et al. |
| 5,975,472 A | 11/1999 | Hung |
| 5,992,809 A | 11/1999 | Sweere et al. |
| 6,012,693 A | 1/2000 | Voeller et al. |
| 6,015,120 A | 1/2000 | Sweere et al. |
| 6,061,104 A | 5/2000 | Evanicky et al. |
| 6,062,148 A | 5/2000 | Hodge et al. |
| 6,126,128 A | 10/2000 | Costa et al. |
| 6,134,103 A | 10/2000 | Ghanma |
| RE36,978 E | 12/2000 | Moscovitch |
| 6,164,612 A | 12/2000 | Schmitt |
| D435,852 S | 1/2001 | Oddsen, Jr. |
| 6,173,933 B1 | 1/2001 | Whiteside et al. |
| 6,179,263 B1 | 1/2001 | Rosen et al. |
| 6,186,459 B1 | 2/2001 | Ma |
| 6,189,842 B1 | 2/2001 | Bergeron Gull et al. |
| 6,216,989 B1 | 4/2001 | Shioya et al. |
| 6,261,023 B1 | 7/2001 | Schmitt et al. |
| 6,394,403 B1 | 5/2002 | Hung |
| 6,398,172 B1 | 6/2002 | Rousek et al. |
| 6,418,010 B1 | 7/2002 | Sawyer |
| 6,419,196 B1 | 7/2002 | Sweere et al. |
| 6,431,511 B1 | 8/2002 | Pfister |
| 6,464,185 B1 | 10/2002 | Minelli et al. |
| 6,476,884 B1 | 11/2002 | Shao |
| 6,478,275 B1 | 11/2002 | Huang |
| 6,481,688 B1 | 11/2002 | Welling et al. |
| 6,484,994 B2 | 11/2002 | Hokugoh |

(56) References Cited

U.S. PATENT DOCUMENTS

| | | |
|---|---|---|
| 6,517,040 B1 | 2/2003 | Wen |
| 6,543,734 B2 | 4/2003 | Yeh |
| 6,554,238 B1 | 4/2003 | Hibberd |
| 6,575,419 B1 | 6/2003 | Masuda et al. |
| D477,606 S | 7/2003 | Theis et al. |
| 6,585,201 B1 | 7/2003 | Reed |
| 6,604,722 B1 | 8/2003 | Tan |
| 6,665,645 B1 | 12/2003 | Ibaraki et al. |
| 6,672,553 B1 | 1/2004 | Lin |
| 6,676,098 B2 | 1/2004 | Lin |
| 6,688,572 B2 | 2/2004 | Huang et al. |
| 6,695,270 B1 | 2/2004 | Smed |
| 6,712,321 B1 | 3/2004 | Su et al. |
| 6,758,454 B2 | 7/2004 | Smed |
| 6,766,994 B2 | 7/2004 | Serbinski et al. |
| D494,183 S | 8/2004 | Wills et al. |
| 6,769,657 B1 | 8/2004 | Huang |
| 6,796,537 B1 | 9/2004 | Lin |
| 6,796,541 B2 | 9/2004 | Lu |
| 6,857,610 B1 | 2/2005 | Conner et al. |
| 6,863,252 B2 | 3/2005 | Bosson |
| 6,874,743 B2 | 4/2005 | Watanabe et al. |
| 6,892,650 B2 | 5/2005 | Baloga et al. |
| 6,896,230 B2 | 5/2005 | Cvek |
| 6,905,101 B1 | 6/2005 | Dittmer |
| 6,912,120 B2 | 6/2005 | Kim et al. |
| 6,947,211 B2 | 9/2005 | Metelski |
| 6,961,234 B2 | 11/2005 | Tanaka et al. |
| 6,962,312 B2 | 11/2005 | Shih |
| 6,987,666 B2 | 1/2006 | Medica et al. |
| D518,063 S | 3/2006 | Piazza et al. |
| 7,028,961 B1 | 4/2006 | Dittmer et al. |
| D520,017 S | 5/2006 | van Kuijk et al. |
| D522,009 S | 5/2006 | Chen |
| D522,010 S | 5/2006 | Piazza et al. |
| 7,061,754 B2 | 6/2006 | Moscovitch |
| D529,033 S | 9/2006 | Hung |
| 7,104,511 B2 | 9/2006 | Smith et al. |
| 7,114,688 B2 | 10/2006 | Rudolf |
| 7,124,989 B1 | 10/2006 | Lee et al. |
| 7,143,478 B2 | 12/2006 | Quijano |
| 7,145,767 B2 | 12/2006 | Mache et al. |
| 7,150,440 B2 | 12/2006 | Yuan |
| 7,152,836 B2 | 12/2006 | Pfister et al. |
| D537,323 S | 2/2007 | Saez |
| 7,178,774 B2 | 2/2007 | Kim |
| 7,198,237 B2 | 4/2007 | Cho et al. |
| 7,198,240 B2 | 4/2007 | Chen |
| 7,207,537 B2 | 4/2007 | Hung |
| 7,215,538 B1 | 5/2007 | Chen et al. |
| D544,489 S | 6/2007 | Oddsen, Jr. et al. |
| 7,227,598 B2 | 6/2007 | Chin |
| 7,233,344 B2 | 6/2007 | Leichter |
| 7,243,892 B2 | 7/2007 | Pfister |
| 7,246,780 B2 | 7/2007 | Oddsen, Jr. |
| 7,252,277 B2 | 8/2007 | Sweere et al. |
| 7,258,311 B2 | 8/2007 | Yen et al. |
| 7,261,266 B2 | 8/2007 | Satterfield |
| 7,264,212 B2 | 9/2007 | Hung |
| 7,267,312 B2 | 9/2007 | Kang et al. |
| D553,135 S | 10/2007 | Muday et al. |
| 7,289,315 B2 | 10/2007 | Hillman et al. |
| D556,205 S | 11/2007 | Wohlford et al. |
| 7,316,377 B2 | 1/2008 | Smed |
| D562,114 S | 2/2008 | Chiu et al. |
| 7,331,551 B2 | 2/2008 | Oddsen, Jr. |
| D563,399 S | 3/2008 | Wohlford et al. |
| 7,338,022 B2 | 3/2008 | Hung |
| 7,345,870 B2 | 3/2008 | Shin |
| D566,531 S | 4/2008 | Massoumi et al. |
| 7,361,046 B2 | 4/2008 | Drew |
| D568,135 S | 5/2008 | Pribyl et al. |
| D568,325 S | 5/2008 | Muday et al. |
| D570,853 S | 6/2008 | Derry et al. |
| 7,380,760 B2 | 6/2008 | Dittmer |
| 7,384,019 B2 | 6/2008 | Choi |
| 7,387,286 B2 | 6/2008 | Dittmer et al. |
| 7,395,995 B2 | 7/2008 | Chen |
| 7,395,996 B2 | 7/2008 | Dittmer |
| 7,396,233 B2 | 7/2008 | Lin |
| 7,399,033 B2 | 7/2008 | Hsiao |
| 7,404,535 B2 | 7/2008 | Mossman et al. |
| 7,410,138 B2 | 8/2008 | Parsons |
| 7,413,152 B1 | 8/2008 | Chen |
| D577,731 S | 9/2008 | Altonji et al. |
| 7,424,991 B2 | 9/2008 | Kim et al. |
| 7,424,994 B2 | 9/2008 | Jeong |
| 7,434,774 B1 | 10/2008 | Floersch et al. |
| 7,438,269 B2 | 10/2008 | Pfister et al. |
| 7,441,981 B2 | 10/2008 | Crain et al. |
| 7,448,584 B2 | 11/2008 | Chen et al. |
| 7,460,186 B2 | 12/2008 | Isobe et al. |
| 7,467,773 B2 | 12/2008 | Ogawa et al. |
| D584,734 S | 1/2009 | Chu |
| 7,487,943 B1 | 2/2009 | Gillespie |
| 7,490,796 B2 | 2/2009 | Kim |
| 7,494,104 B2 | 2/2009 | Baek |
| 7,497,408 B2 | 3/2009 | Lim et al. |
| 7,503,538 B2 | 3/2009 | Liou et al. |
| 7,510,154 B2 | 3/2009 | Oddsen, Jr. et al. |
| 7,510,155 B2 | 3/2009 | Huang et al. |
| 7,510,241 B2 | 3/2009 | Nathan et al. |
| 7,513,469 B1 | 4/2009 | Diungan |
| 7,515,402 B2 | 4/2009 | Tsuo |
| 7,516,924 B2 | 4/2009 | White et al. |
| 7,516,925 B2 | 4/2009 | Sawai et al. |
| 7,520,480 B2 | 4/2009 | Lee |
| 7,529,083 B2 | 5/2009 | Jeong |
| 7,537,189 B2 | 5/2009 | Jung et al. |
| D596,188 S | 7/2009 | Lau et al. |
| 7,564,682 B2 | 7/2009 | Liou et al. |
| D598,917 S | 8/2009 | Luber |
| 7,573,711 B2 | 8/2009 | Kim et al. |
| 7,575,265 B2 | 8/2009 | Vitito |
| 7,578,490 B2 | 8/2009 | Kim |
| 7,593,218 B2 | 9/2009 | Hwang et al. |
| 7,593,219 B2 | 9/2009 | Quijano et al. |
| 7,600,728 B2 | 10/2009 | Petrick et al. |
| 7,604,210 B2 | 10/2009 | Oddsen, Jr. et al. |
| 7,607,620 B2 | 10/2009 | Ozolins et al. |
| 7,621,500 B2 | 11/2009 | Ishizaki et al. |
| 7,623,342 B2 | 11/2009 | Ozolins et al. |
| 7,628,361 B2 | 12/2009 | Gan et al. |
| 7,630,193 B2 | 12/2009 | Ledbetter et al. |
| 7,634,127 B1 | 12/2009 | Sundararajan et al. |
| 7,636,133 B1 | 12/2009 | Hsu |
| 7,643,276 B2 | 1/2010 | Shin |
| 7,644,898 B2 | 1/2010 | White et al. |
| 7,645,870 B2 | 1/2010 | Khvorova et al. |
| 7,648,112 B2 | 1/2010 | Wu et al. |
| 7,651,058 B2 | 1/2010 | Cho et al. |
| 7,661,642 B2 | 2/2010 | Oh et al. |
| 7,661,643 B2 | 2/2010 | Oh |
| 7,663,699 B2 | 2/2010 | Sakata et al. |
| 7,669,808 B2 | 3/2010 | Lai et al. |
| 7,694,927 B2 | 4/2010 | Chuang |
| 7,703,733 B2 | 4/2010 | Price et al. |
| D631,052 S | 1/2011 | Hung |
| RE42,581 E | 8/2011 | Carnevali |
| D645,868 S | 9/2011 | Lau et al. |
| 8,066,232 B2 | 11/2011 | Wills et al. |
| D654,503 S | 2/2012 | Sapper |
| D660,845 S | 5/2012 | Schmauch et al. |
| D668,256 S | 10/2012 | Matteo |
| D670,554 S | 11/2012 | Bowman et al. |
| D675,905 S | 2/2013 | Bowman et al. |
| 8,366,060 B2 | 2/2013 | Hung |
| 8,708,298 B2 | 4/2014 | Hu et al. |
| 8,827,227 B2 | 9/2014 | Nagaoka et al. |
| 2002/0162921 A1 | 11/2002 | Rotondi |
| 2003/0075653 A1 | 4/2003 | Li |
| 2004/0011932 A1 | 1/2004 | Duff |
| 2004/0011938 A1 | 1/2004 | Oddsen, Jr. |
| 2004/0188578 A1 | 9/2004 | Turner |

(56) References Cited

U.S. PATENT DOCUMENTS

| | | |
|---|---|---|
| 2004/0189890 A1 | 9/2004 | Yen et al. |
| 2004/0195471 A1 | 10/2004 | Sachen, Jr. |
| 2004/0245419 A1 | 12/2004 | Sweere et al. |
| 2004/0262474 A1 | 12/2004 | Boks et al. |
| 2005/0001122 A1 | 1/2005 | Chen |
| 2005/0035252 A1 | 2/2005 | Chen |
| 2005/0205734 A1 | 9/2005 | Wang |
| 2005/0252336 A1 | 11/2005 | Coral et al. |
| 2006/0060735 A1 | 3/2006 | Oddsen, Jr. et al. |
| 2006/0084913 A1 | 4/2006 | Lo |
| 2006/0157627 A1 | 7/2006 | Hung |
| 2006/0175499 A1 | 8/2006 | Price et al. |
| 2006/0186295 A1 | 8/2006 | Dittmer et al. |
| 2006/0187625 A1 | 8/2006 | Jung et al. |
| 2006/0219849 A1 | 10/2006 | Chiu |
| 2006/0226326 A1 | 10/2006 | Asamarai et al. |
| 2006/0238967 A1 | 10/2006 | Carson et al. |
| 2006/0266903 A1 | 11/2006 | Oddsen, Jr. et al. |
| 2006/0274487 A1 | 12/2006 | Wang et al. |
| 2006/0291151 A1 | 12/2006 | Chen |
| 2007/0102596 A1 | 5/2007 | Sung |
| 2007/0125914 A1 | 6/2007 | Liou |
| 2007/0139870 A1 | 6/2007 | Lin |
| 2007/0181755 A1 | 8/2007 | Oh et al. |
| 2007/0181762 A1 | 8/2007 | Dittmer |
| 2007/0194196 A1 | 8/2007 | Pfister |
| 2007/0205340 A1 | 9/2007 | Jung |
| 2007/0262215 A1 | 11/2007 | Tan |
| 2008/0023599 A1 | 1/2008 | Lin |
| 2008/0029661 A1 | 2/2008 | Chen |
| 2008/0029669 A1 | 2/2008 | Olah et al. |
| 2008/0054133 A1 | 3/2008 | Huang |
| 2008/0100996 A1 | 5/2008 | Wang |
| 2008/0116318 A1 | 5/2008 | Wesley et al. |
| 2008/0156953 A1 | 7/2008 | Oh et al. |
| 2008/0164395 A1 | 7/2008 | Chang et al. |
| 2009/0008518 A1 | 1/2009 | Shen |
| 2009/0020673 A1 | 1/2009 | Dittmer |
| 2009/0050760 A1 | 2/2009 | Duff |
| 2009/0084913 A1 | 4/2009 | Grabania et al. |
| 2009/0090831 A1 | 4/2009 | Henning et al. |
| 2009/0146024 A1 | 6/2009 | Duan |
| 2009/0166501 A1 | 7/2009 | Wang et al. |
| 2009/0212184 A1 | 8/2009 | Bourgeois et al. |
| 2009/0224122 A1 | 9/2009 | Liao |
| 2009/0308990 A1 | 12/2009 | Yen et al. |
| 2010/0001563 A1 | 1/2010 | Baru |
| 2010/0148020 A1 | 6/2010 | Wills et al. |
| 2010/0214469 A1 | 8/2010 | Duncan |
| 2010/0327129 A1 | 12/2010 | Chen |
| 2011/0303805 A1 | 12/2011 | Lau et al. |
| 2012/0267497 A1* | 10/2012 | Bowman ............... F16M 11/10 248/280.11 |
| 2012/0292463 A1 | 11/2012 | Burns |
| 2013/0314890 A1* | 11/2013 | Smith .................... F16M 11/10 361/825 |

FOREIGN PATENT DOCUMENTS

| | | |
|---|---|---|
| DE | 202006010262 U1 | 12/2006 |
| EP | 1471300 A2 | 10/2004 |
| EP | 1471300 A3 | 4/2005 |
| EP | 1895225 A1 | 3/2008 |
| GB | 2366083 | 2/2002 |
| GB | 2438581 | 12/2007 |
| GB | 2447623 | 9/2008 |
| TW | M368005 U | 11/2009 |
| WO | 2007/137905 | 12/2007 |
| WO | 2008/092457 | 8/2008 |
| WO | 2008/098378 | 8/2008 |

OTHER PUBLICATIONS

International Search Report for International application No. PCT/GB2011/000874, dated Dec. 15, 2011 (4 pages).
Written Opinion of the International Search Authority for International Application No. PCT/GB2011/000874, dated Dec. 15, 2011 (14 pages).
International Preliminary Report on Patentability for International Application No. PCT/GB2011/000874, dated Dec. 10, 2012 (15 pages).
Colebrook Bosson Saunders line drawing and pricing sheet entitled "Wishbone arms on 400 mm post with Back to back bracket," dated May 17, 2010 (1 page).
Colebrook Bosson Saunders line drawing and pricing sheet entitled "Two sets of Wishbone arms on 400 mm post," dated May 17, 2010 (1 page).
Colebrook Bosson Saunders line drawing and pricing sheet entitled "Daisyone arms on 500 mm post," dated May 17, 2010 (1 page).
Colebrook Bosson Saunders line drawing and pricing sheet entitled "Wishbone Rotation arms on 400 mm post with Back to back bracket," dated May 17, 2010 (1 page).
Colebrook Bosson Saunders line drawing and pricing sheet entitled "Zorro arms on 300 mm post with Back to back bracket," dated May 17, 2010 (1 page).
Colebrook Bosson Saunders line drawing and pricing sheet entitled "Gissele gas lift arms on 200 mm post with Back to back bracket," dated May 17, 2010 (1 page ).
Colebrook Bosson Saunders line drawing and pricing sheet entitled "Two sets of Rodney arm," dated May 17, 2010 (1 page).
Colebrook Bosson Saunders line drawing and pricing sheet entitled "Wishbone arms mounted to 1000 mm toolbar on 400 mm posts," dated May 17, 2010 (1 page).
Colebrook Bosson Saunders line drawing and pricing sheet entitled "Wishbone Plus on 500 mm post with SP1320 dual monitor mount," dated May 17, 2010 (1 page).
DPG, Cygnus Gas Lift Arm (Silver) up to 10kg, © 2008 (1 page).
Ergotron, 45-241-026 LX Desk Mount LCD Arm, © 2011 (3 pages).
Ergotron, 45-214-026 MX Desk Mount LCD Arm, © 2011 (2 pages).
Ergotron, 45-174-300 Neo Flex® LCD Arm, © 2011 (2 pages).
Ergotron, 33-310-060 Neo Flex® LCD Stand, © 2011 (2 pages).
Hafele UK Ltd., Heavy Duty Spring/Long Arm, © 2011 (2 pages).
Humanscale, M2 Articulating Monitor Arm, available rior to at least Jun. 9, 2011 (1 page).
Humanscale, M4 Articulating Monitor Arm, available prior to at least Jun. 9, 2011 (1 page).
Humanscale, M7 Articulating Monitor Arm, available prior to at least Jun. 9, 2011 (1 page).
Innovative Office Products, 7Flex® LCD Arm (24"), available prior to at least Jun. 9, 2011 (1 page).
Innovative Office Products, EVO® LCD Arm 5545, available prior to at least Jun. 9, 2011 (1 page).
Office Action from U.S. Appl. No. 11/270,026 dated Nov. 16, 2007 (10 pages).
Notice of Abandonment from U.S. Appl. No. 11/270,026 dated May 30, 2008 (2 pages).
Search Report for Great Britain Application No. 1009680.8 dated Sep. 15, 2010 (1 page).
Search Report for Great Britain Application No. 1009680.8 dated Feb. 17, 2011 (3 pages).

* cited by examiner

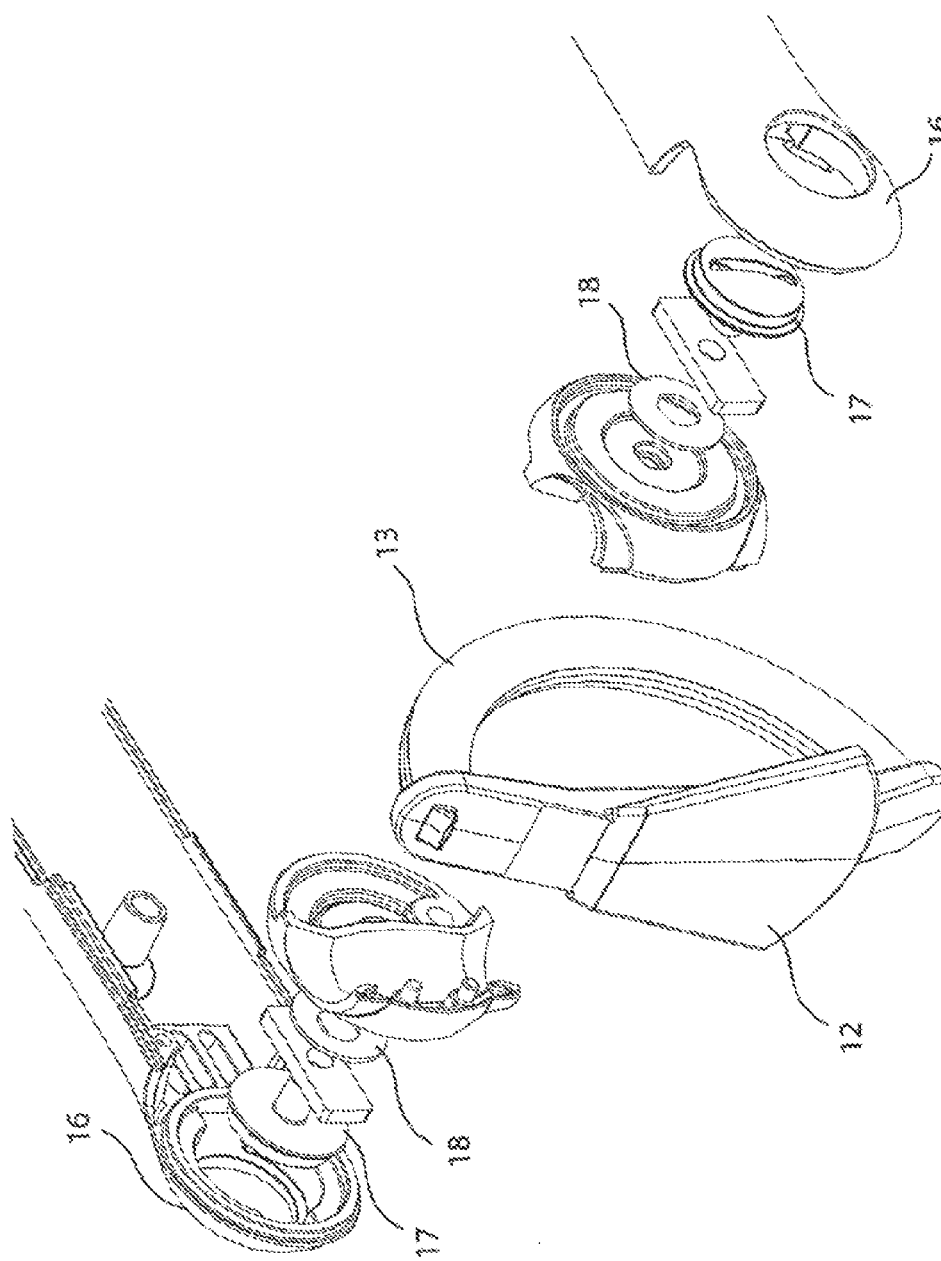

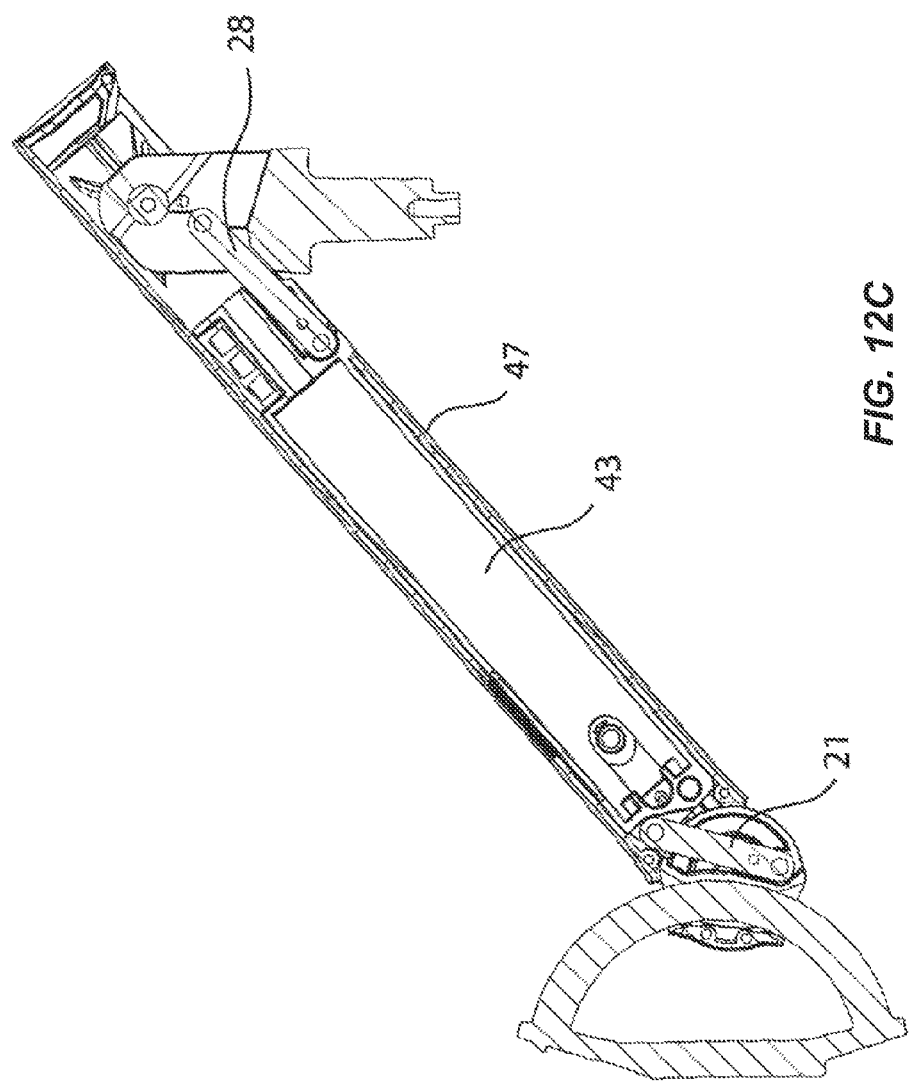

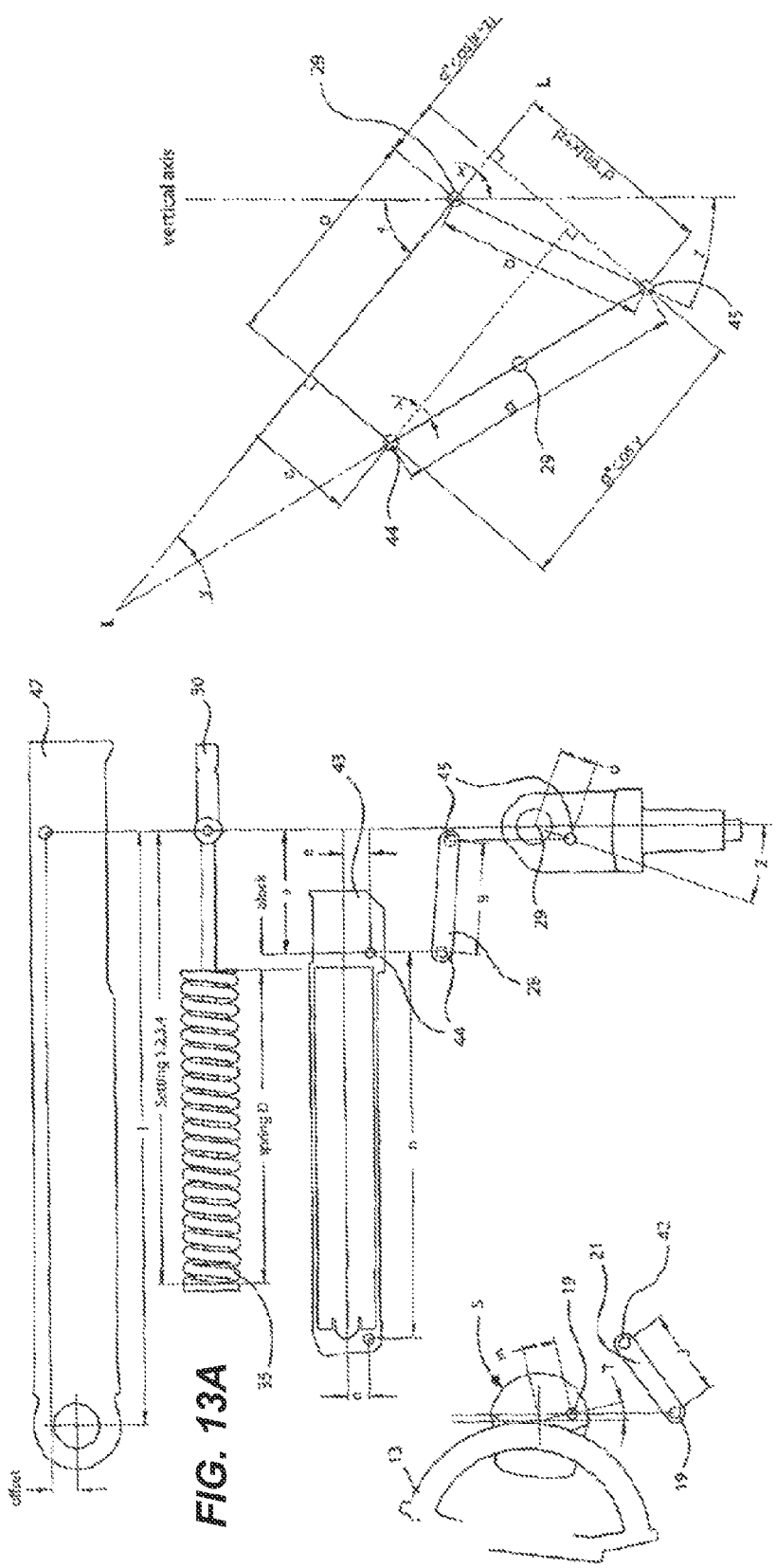

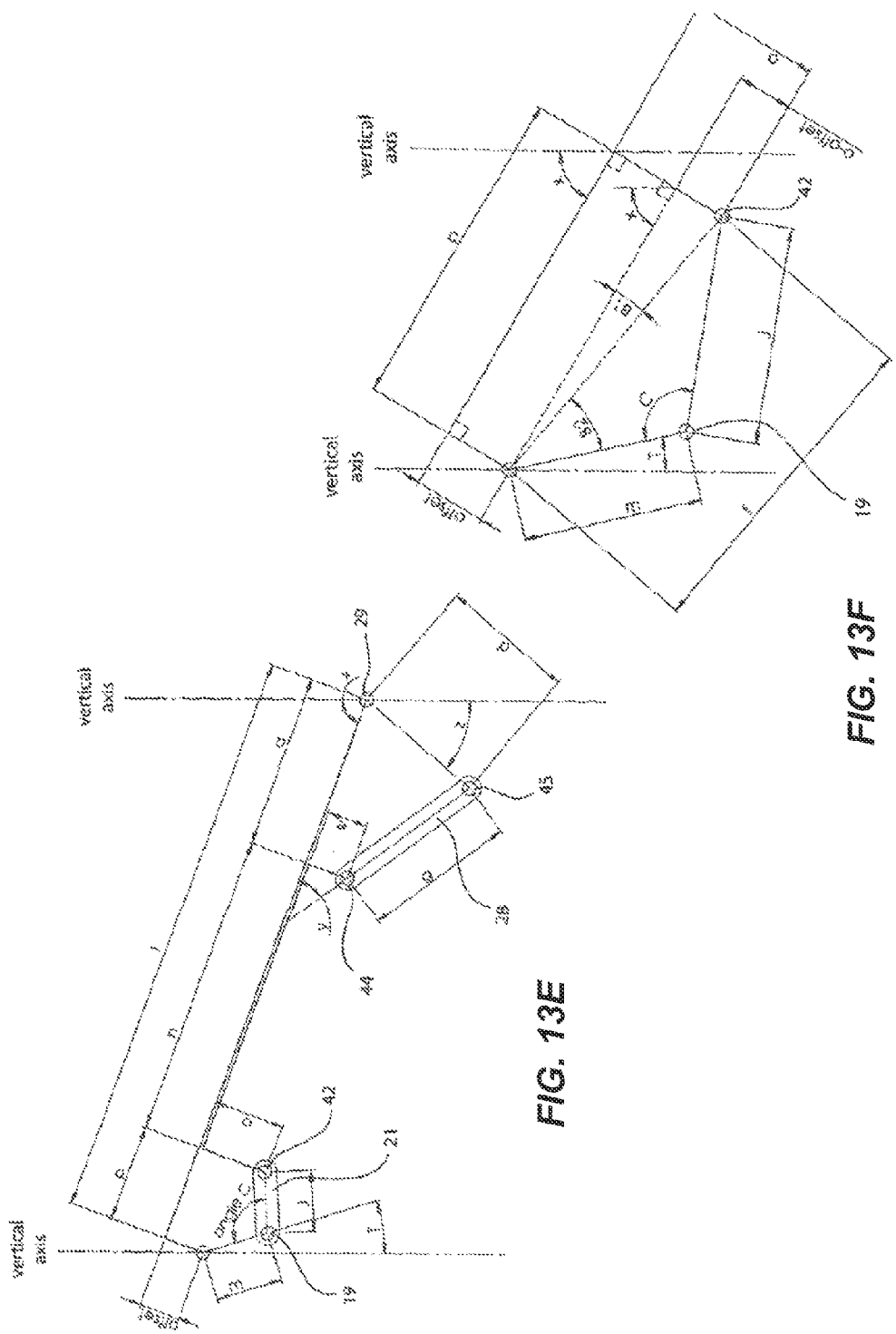

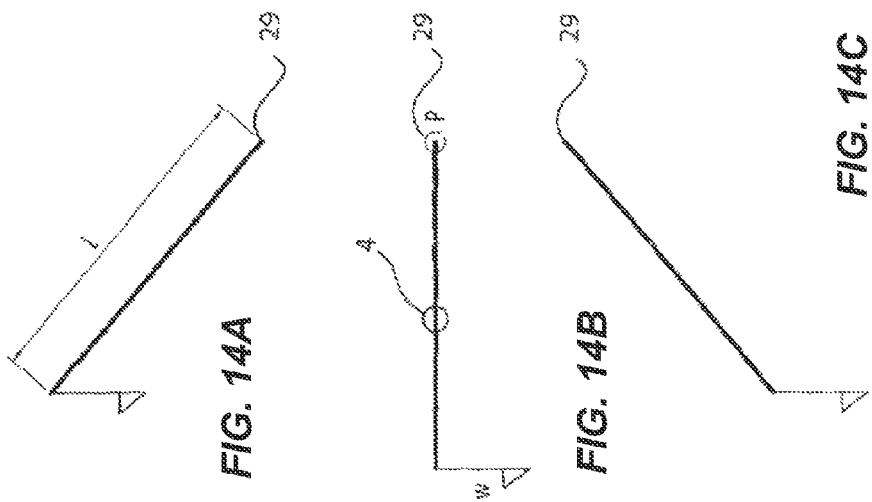
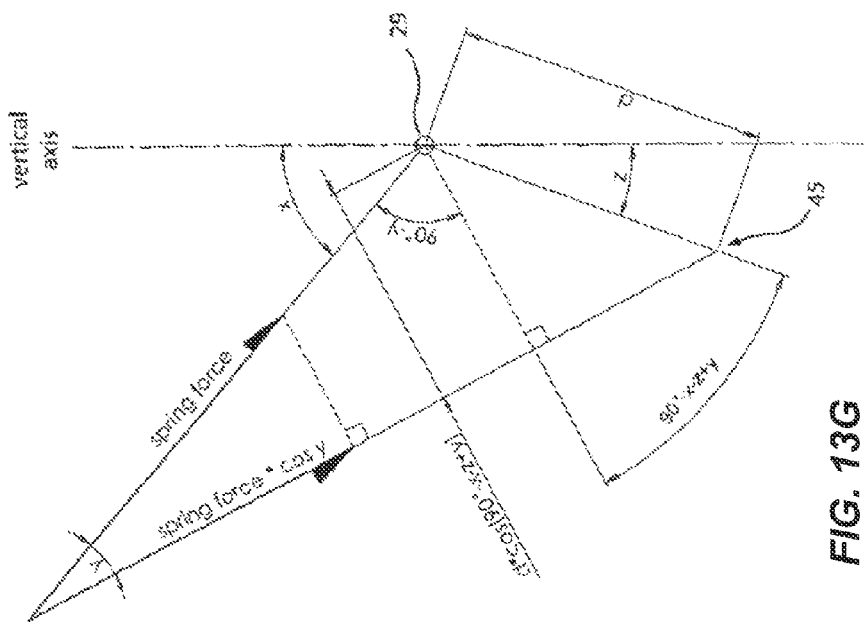

w - weight
P - pivot
L - arm length
b - sliding dist
d - pivot dist.
G - spring force
S - force opposed by link
e - dist. perpendicular to link (force)

w - weight
P - pivot
L - arm length
b - sliding dist
d - pivot dist.
G - spring force
S - force opposed by link
e - dist. perpendicular to link (force)

SUPPORT SYSTEM

This application is a divisional of U.S. application Ser. No. 13/702,180 filed Feb. 7, 2013, which is a national phase filing under 35 USC 371(c)(1) of Patent Cooperation Treaty Application No. PCT/GB2011/000874 filed Jun. 9, 2011, which is a continuation-in-part of U.S. application Ser. No. 13/024,685 filed Feb. 10, 2011, which claims priority to United Kingdom Application No. GB1009680.8 filed Jun. 9, 2010. The entire contents of the above-mentioned patent applications are incorporated herein by reference.

BACKGROUND

The present invention is concerned with a support system. Particular embodiments of the invention are concerned with a moveable support arm for a monitor or display device.

Modern screen-based display devices are typically flat-screen monitors such as liquid crystal display (LCD) or plasma screen displays. Such devices can be mounted on elevated support devices such as a support arm which can then be secured to a surface such that the flat-screen monitor is held above or in front of the surface.

Support systems for monitors are known which allow for movement in three dimensions of the head, mount or bracket on which the monitor is mounted. This is so as to allow for a full range of adjustment of the monitor. GB 2 438 581 and U.S. Pat. No. 7,438,269 both disclose mounts or brackets including an arcuate connection which allows a monitor to be pivoted about a substantially horizontal virtual pivot axis. In U.S. Pat. No. 7,438,260 the virtual pivot axis passes through the centre of gravity of a monitor or display so as to reduce the forces necessary to hold the mount in place at a selected position on the arcuate connection.

In order to allow for adjustment about a substantially vertical axis (or an axis orthogonal to the axis of the arcuate connection), known arrangements such as those disclosed in GB 2 438 581 and U.S. Pat. No. 7,438,269 have a second pivoting mechanism entirely separate from the first. The second pivot is a separate vertical rod-like element defining a vertical axis. This second pivot is distinct and separated from the pivot of the arcuate connector.

These prior art arrangements require two separate and distinct pivot arrangements. They are therefore relatively complicated and expensive to build, have two pivots (and therefore more moving parts) which can fail and are relatively unsightly.

SUMMARY

The present invention, in its first aspect, provides a single simple mechanism which allows a full range of adjustment of a load in three orthogonal directions (i.e. about orthogonal X, Y and Z axes). This mechanism is easier and cheaper to make than the know arrangements and is aesthetically more pleasing.

Support systems for monitors comprising an articulated arm arrangement for raising and lowering a monitor are known with tiltable mount or bracket mechanisms which keep the monitor in the same plane as the arm moves up and down. The known arrangements such as those disclosed in US 2004/0245419 have a four bar linkage or parallelogram arrangement in which there is a second link or arm below (or above) and parallel to the main support arm and pivotally coupled to the tiltable mount or bracket on which a monitor is mounted. The second link or arm is pivotally coupled to the mount or bracket below (or above) the pivot between the main support arm and the mount, and also pivotally coupled to the base or support element to which the other end of the main support arm is pivotally coupled at a point below (or above) the pivot between the main support arm and the base or support element. The main support arm and the second link arm are parallel to each other and the linkage (which can be considered to be a line drawn between) the pairs of pivots on each of the base element and mount are also parallel to each other.

This parallelogram four-bar linkage means that as the support arm is moved up and down the linkage between the two pivots on the tilt mount remains in the same plane parallel to the linkage between the two pivots on the base element.

A disadvantage of the known four-bar parallelogram linkage arrangements is the need to provide a second link parallel to and separate from the support arm. Such arrangements therefore must have a second visible (and therefore unsightly) link or arm parallel to the main support arm. Alternatively, such parallelogram arrangements have a large deep casing which can house the main support arm, the second parallel link and the space therebetween. This is bulky and therefore also unsightly.

The support system of the present invention in its second aspect eliminates the need for a second parallel link separated from the first and a vertical separation between the two parallel links. The present invention in its second aspect therefore allows for a more compact and aesthetically pleasing support arm which keeps its load mount in the same plane as the support arm moves up and down.

The use of a slider element moveable along the longitudinal axis of the support arm (without a component of movement orthogonal or perpendicular thereto) allows for an aesthetically pleasing structure without a second visible arm with a component of movement both along and perpendicular to the support arm.

A problem with articulated support arms for loads such as monitors or display devices which move up and down as they pivot about a horizontal axis, is the varying torque created by the constant weight of the monitor applied about the horizontal axis. As the arm moves up and down the distance from the load at the end of the support arm to the other end of the support arm and the pivot between the support arm and its base varies. The maximum distance and hence torque is when the arm is horizontal (see FIGS. 12b and 14b) and at its minimum when in its uppermost (see FIGS. 12a and 14a) and lowermost (see FIGS. 12c and 14c) positions.

In order to oppose this varying torque it is known (see, for example, US 2004/0245419) to provide a compression spring which provides a variable force to create a torque to oppose and match the torque created by the weight of the load. The spring is subject to a cam arrangement which controls the degree of compression of the spring and hence the force it applies. Cam arrangements of the type disclosed in US 2004/0245419 are relatively complex and hence expensive to make.

The present invention in its third aspect provides an arrangement for varying the torque applied to oppose the variations in torque resulting as the support arm is pivoted about a horizontal axis.

The invention in its third aspect provides a mechanism which allows the variations in torque provided by the force generating member as the support arm pivots and which opposes the weight of a load on the support arm to better match the variations in torque provided by the weight as the support arm pivots. The inventors of the subject application are the first to realise that taking the step of moving the proximal force transmission link pivot away from its usual position on the line vertically through the proximal support arm pivot and substantially orthogonal to the longitudinal axis of the support arm when this is at the mid-point of its range of movement about the proximal support arm pivot allows one to better match the shape of the graphs of variation in supporting torque and load weight torque with support arm movement to each other and hence better support a load on the support arm. The inventors are the first to appreciate that the counter-intuitive step of moving away from the essentially symmetrical proximal support arm pivot and proximal force transmission pivot arrangement of the prior art actually allows one to produce a more symmetrical variation in supporting torque to better match load weight torque.

The third aspect provides a support system for supporting a load such as a display device, the support system comprising a mount for a load, a base element and a support arm coupling the mount and base element at, respectively, distal and proximal portions of the support arm, and pivotally connected to at least the base element, wherein the support arm includes: a proximal support arm pivot coupling a proximal portion of the support arm to the base element; a force transmission member link for providing a torque about the proximal support arm pivot to oppose the torque about the proximal support arm pivot arising from a load on the mount, wherein the force transmission link is between, and pivotally connected to, a force generating member within or alongside the support arm, and a base element, at, respectively, distal and proximal portions of the link, the link including, a proximal force transmission link pivot coupling a proximal portion of the link to the base element and a distal force transmission link pivot coupling a distal portion of the link to the force generating member at a position between the proximal and distal portions of the support arm, and wherein the proximal force link pivot is displaced from a vertical line through the proximal support arm pivot.

In some configurations of the third aspect, the support arm is pivotally connected to the mount and the base element. In some configurations of the third aspect, the longitudinal axis of the support arm is substantially horizontal at the midpoint of the range of movement of the support arm, and the proximal force arm pivot is displaced from a vertical axis passing through the first proximal support arm pivot, in a direction towards the distal end of the support arm. In some configurations of the third aspect, the force generating member is held within the slider element and acts against the proximal end of the slider element, and the distal force transmission pivot couples the slider element and the force transmission link. In some configurations of the third aspect, the force generating member is a spring for applying a force to the distal end of the force transmission link. In some configurations of the third aspect, the spring is a compression spring. Some configurations of the third aspect include a slider element housing the spring, arranged within the support arm and moveable along the longitudinal axis of the support arm, the spring applying a force to the proximal end of the slider element which is itself coupled to the distal end of the force transmission link.

The invention in its fourth aspect provides a method of designing a support system. The inventors have appreciated that it is possible to provide an aesthetically pleasing support system which does not require a complicated arrangement to match its variations in torque caused by a load on the system as it moves through its range of movement by careful selection of the dimensions and geometry of that system.

Preferred embodiments of the present invention will now be described, by way of non-limiting example only, with reference to the attached figures. The figures are only for the purposes of explaining and illustrating preferred embodiments of the invention and are not to be construed as limiting the claims. The skilled man will readily and easily envisage alternative embodiments of the invention in its various aspects.

BRIEF DESCRIPTION OF THE DRAWINGS

FIG. 8 is an exploded view of the upper end of the upper arm and the mounting and movement head of FIGS. 1 to 6;

FIGS. 12a to 12c are cross-sectional views along part of section X-X of FIG. 3 which illustrate the invention in its second aspect as the upper support arm pivots;

FIGS. 13a to 13g are schematic views of the geometric relationship between the different components of the device of FIG. 1 and wherein FIG. 13a is an exploded side view of the arm 4;

FIG. 13b is a side cross-sectional view through the mounting head, FIG. 13c is a side cross-sectional view through the mid joint 31, FIG. 13d illustrates the geometry at the proximal end of the support arm, FIG. 13e illustrates the geometry of the support arm and its pivots, and FIG. 13g illustrates the geometry at the distal end of the support arm;

FIGS. 14a to 14c illustrate the variation in torque created about the pivot on the bottom end of the upper arm of FIGS. 1 to 12 by the weight of, for example, a monitor mounted at its upper end, as the support arm pivots about that pivot at its bottom end;

DETAILED DESCRIPTION

Figure 1:
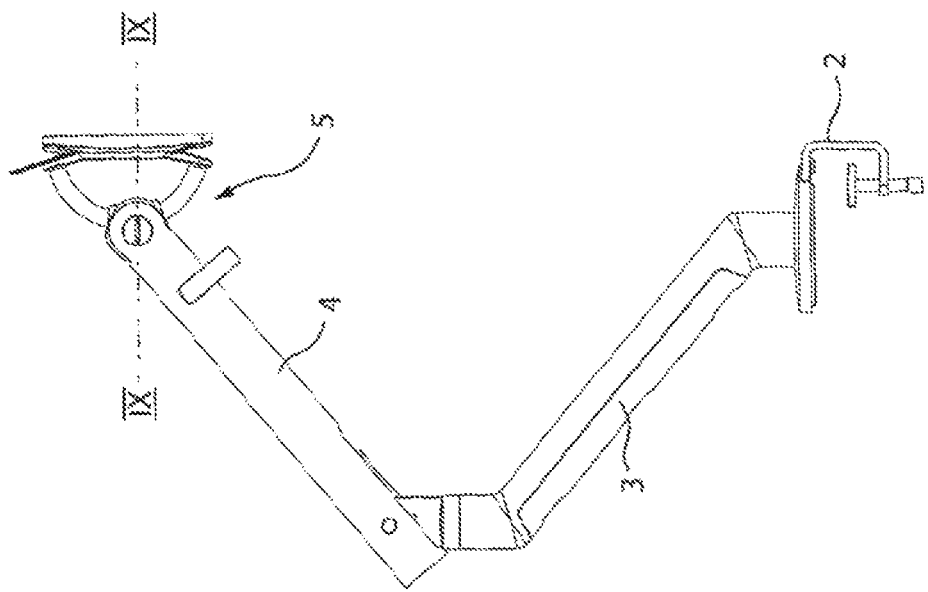
FIG. 1 is a perspective view of a support device embodying the present invention.
Figure 2:
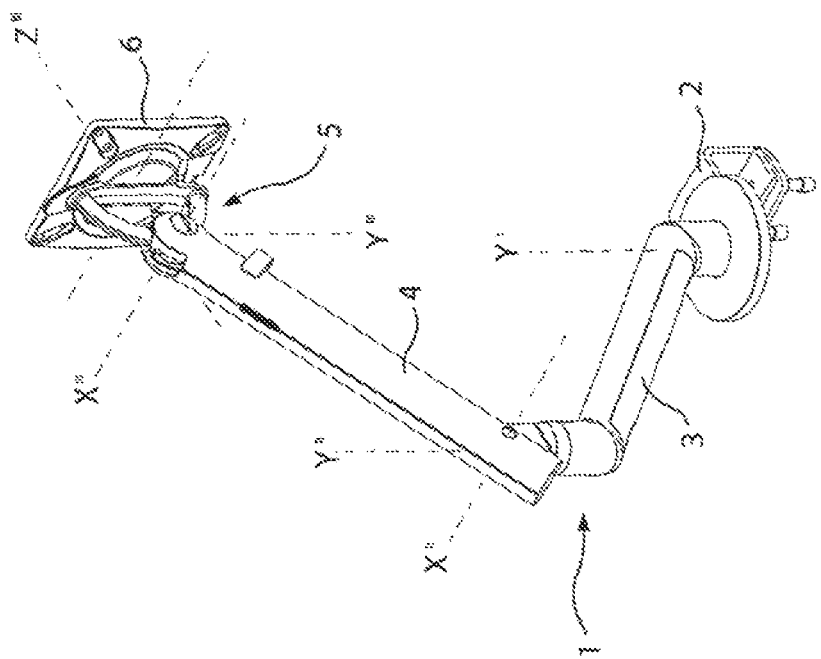
FIG. 2 is a side view of the support device of FIG. 1.
Figure 4:
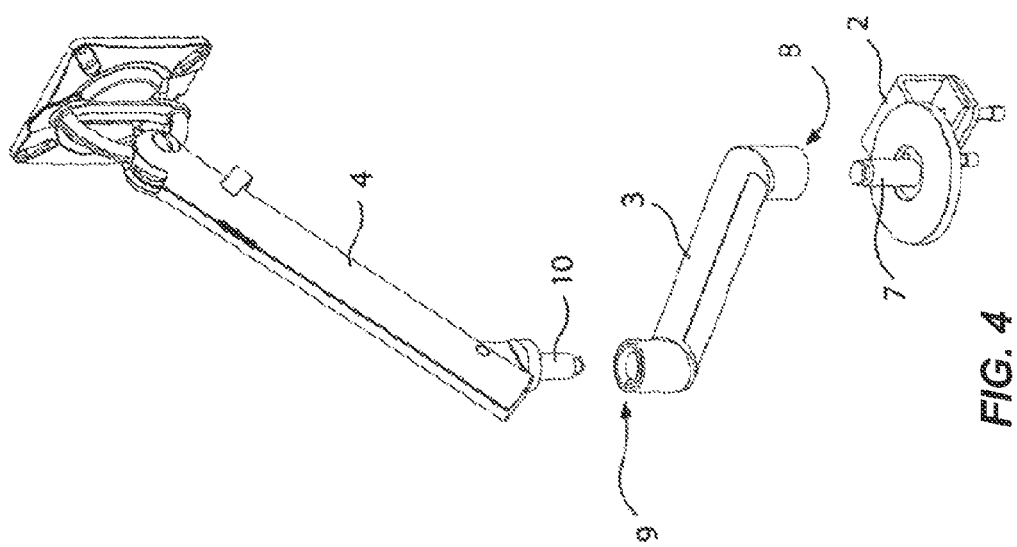
FIG. 4 is a partially exploded view of the support device of FIGS. 1 to 3.
Figure 3:
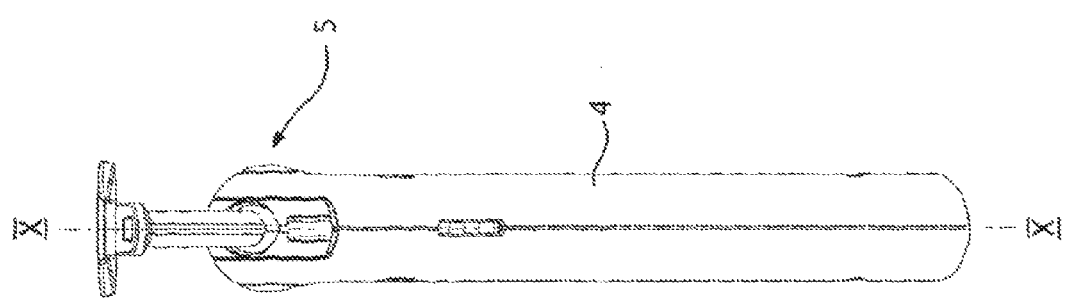
FIG. 3 is a top view of the support device of FIG. 1.

Referring to FIGS. 1 to 3, a support device 1 includes a table securing element 2, a lower arm 3, upper arm 4, monitor mounting head and pivot 5, and a monitor plate 6 for securing to the back of a monitor to be supported (not shown). The table securing element 2 has a screw or clamp arrangement for removably securing the element 2 to a table or other surface and an upstanding pin 7 received within a corresponding hole 8 in the end of the lower arm 3 such that the lower arm 3 can rotate about a vertical Y' axis (see FIG. 1) relative to the table securing element 2. The lower arm 3 then has a hole or female coupling 9 at its upper end to receive a pin or male coupling 10 at the bottom end of the upper arm 4. The upper arm 4 can rotate about a vertical axis Y" (see FIG. 1) relative to the lower arm 3 by virtue of this pin and hole engagement.

Referring to FIG. 1, the lower arm 3 can rotate relative to the table securing element 2 about a vertical axis Y', the upper arm 4 can rotate relative to the lower arm 3 about a vertical axis Y" and a horizontal axis X", and (as discussed in more detail below) the mounting head 5 can rotate relative to the distal end of the upper support arm 4 about two orthogonal axes (one substantially horizontal axis X'" and the other substantially vertical axis Y'"). The mounting head 5 can also rotate about a horizontal axis Z'" orthogonal to the X'" and Y'" axes.

Referring to FIGS. 5 to 8, the mounting head 5 comprises a movement joint hoop 11 with a fixing portion 12 for slidable engagement with the monitor supporting plate 6, and an elongate curved member, arc or hoop segment 13 of substantially circular cross-section. A motion joint 14 with an internal circular bearing surface 15 corresponding to the circumference of the curved member 13 is positioned on the curved member 13 and can move along the hoop segment or curved member 13 and rotate around the hoop segment or curved member 13. The motion joint 14 is a two-part plastics moulding. The plastics moulding is held between two projecting portions 16 at the distal end of the upper support arm 4. Slotted screws 17 apply pressure to the outside of each side of the moulding via rectangular nuts and Belleville washers 18 so that the motion joint is frictionally engaged on the hoop.

The projecting portions 16 can rotate relative to the motion joint 14 such that the movement joint hoop 11 can rotate about horizontal axis X'". Projecting portions 60 on the inside of the upper arm projections 16 engage a track 61 on the motion joint 14 to allow this relative rotation about axis X'".

Figure 5:
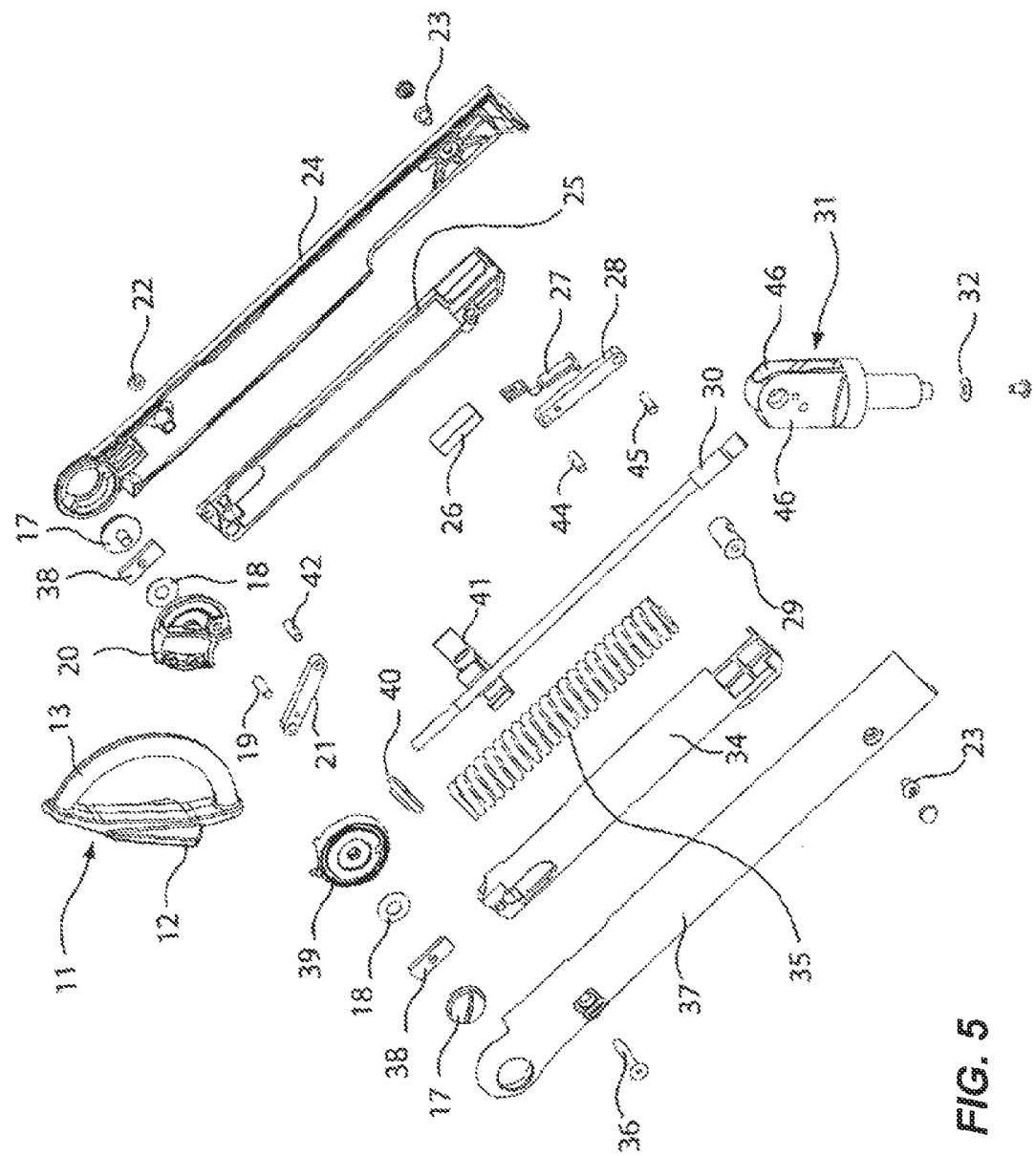
FIG. 5 is an exploded view of the upper arm of the support device of FIGS. 1 to 4.
Figure 7:
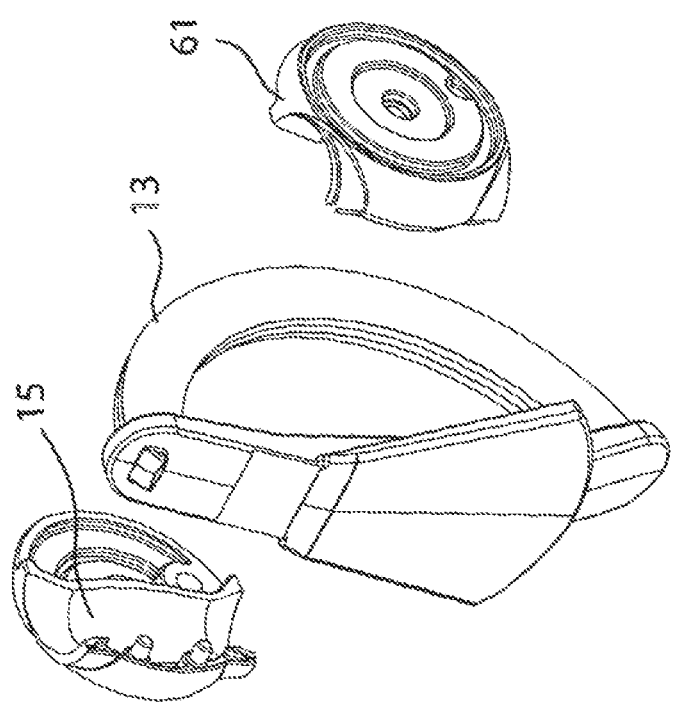
FIG. 7 is a partially exploded view of portions of the mounting and movement head of FIG. 6.
Figure 6:
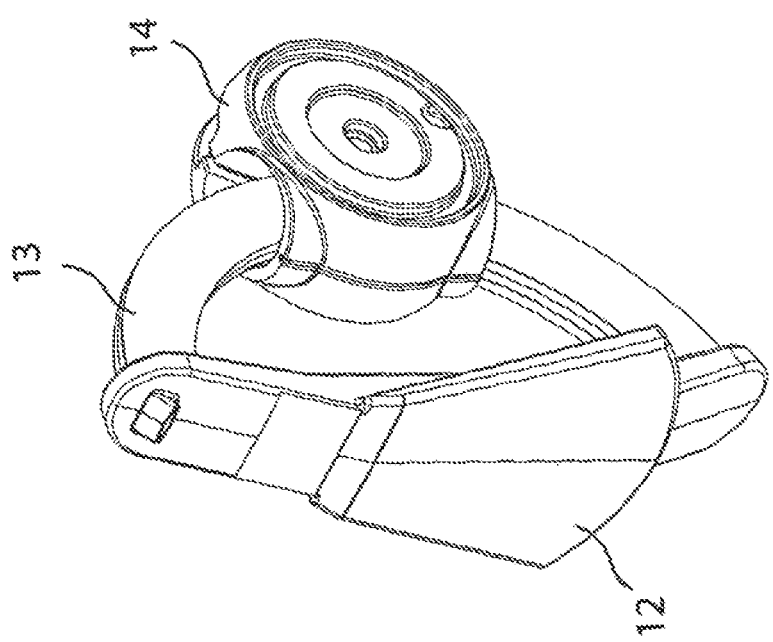
FIG. 6 is a perspective view of the mounting and movement head of the device of FIGS. 1 to 5.

Referring to FIG. 5, the support device 1 includes movement joint hoop 11, distal front link pivot pin 19, proximal front link pivot pin 42, motion joint moulding left half 20, motion joint adjustment screws 17, Belleville washers 18, front link 21, thin hex nut 22, mid joint button screws 23, upper arm casting left half 24, spring slider moulding left half 25, friction pad 26, anti-finger trap moulding 27, power link 28, mid joint button pivot pin 29, force adjustment screw 30, mid joint 31, steel washer 32, spring slider moulding right half 34, compression spring 35, head screw 36, upper arm casting right half 37, rectangular nuts 38, motion joint moulding right half 39, spring nut plate 40 and cable management clip 41.

Figure 10B:
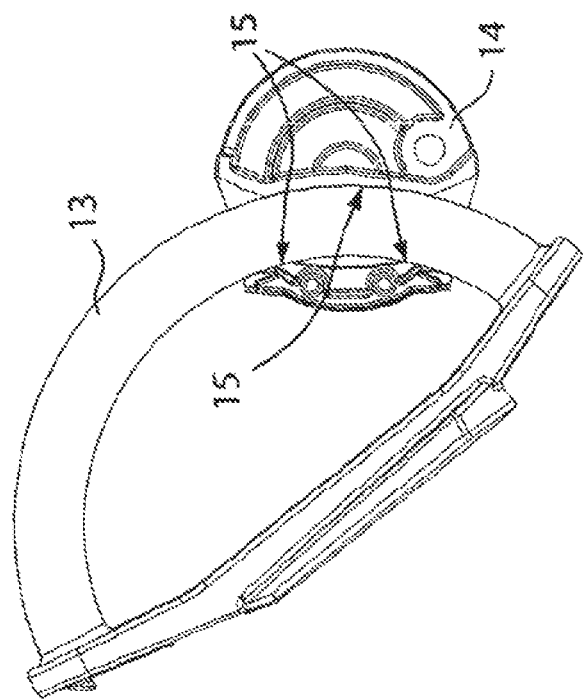
FIGS. 10a and 10b are cross-sectional views along part of section X-X in FIG. 3 illustrating adjustment of the mounting and movement head in a first plane.
Figure 10A:
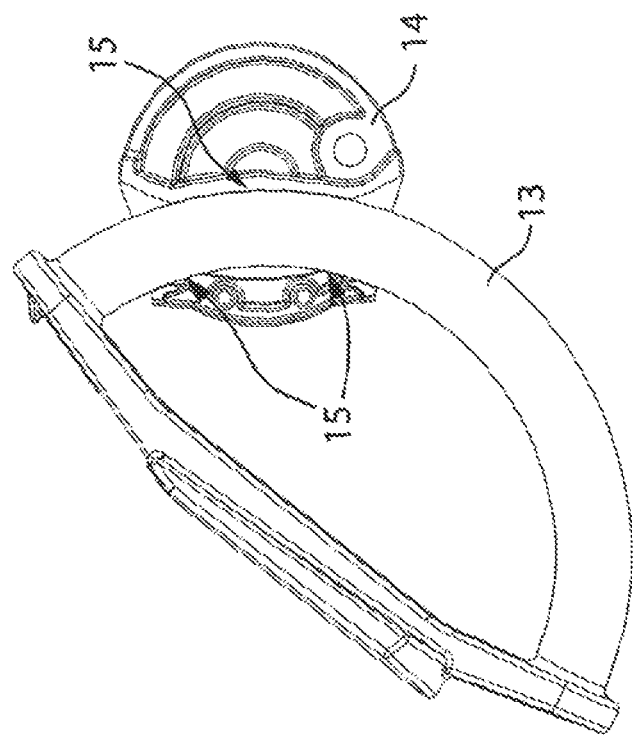

As illustrated in FIGS. 10a and 10b, the motion joint 14 can move relative to the curved member 13. In this application we will usually refer to movement of the motion joint along the hoop or hoop segment. This expression refers to relative movement in a direction along the curvature of the curved member 13 and includes movement of the motion joint with the hoop remaining still, movement of the hoop with the motion joint remaining still and movement of both the motion joint and hoop.

Figure 11A:
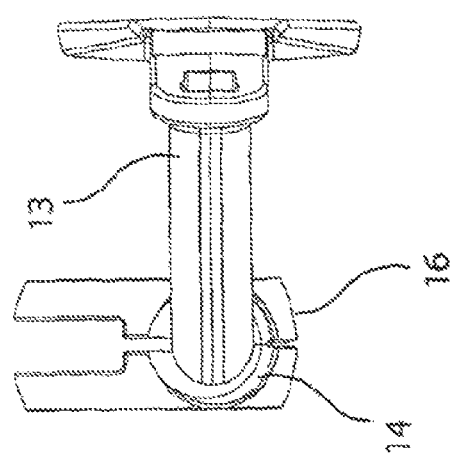
FIGS. 11a to 11c are top views of the mounting and movement head illustrating adjustment of the mounting and movement head in a second plane orthogonal to the plane of the section of FIGS. 10a and 10b.
Figure 11B:
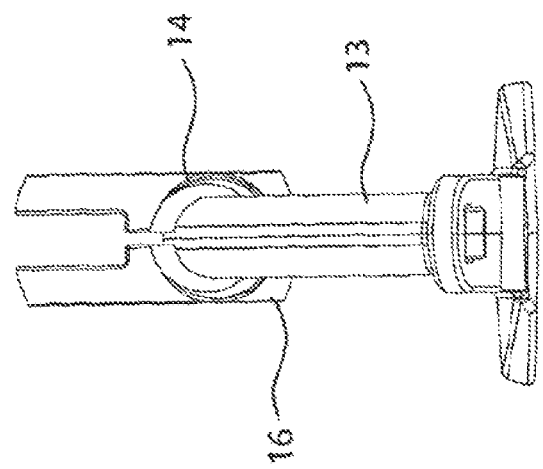
Figure 11C:
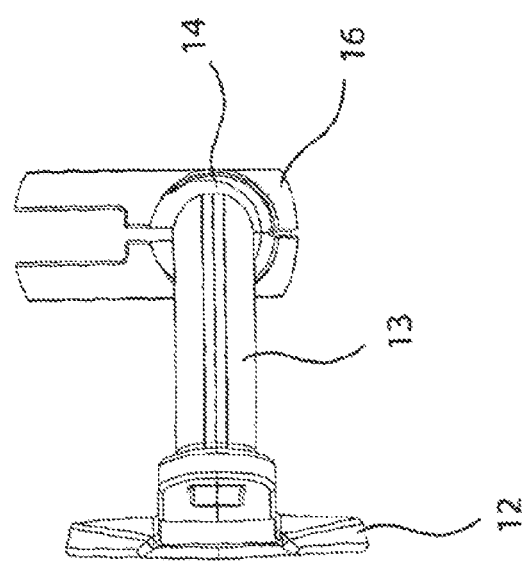

In a particularly preferred embodiment of the invention, the curved member 13 lies on the circumference of a circle whose centre lies at or near the centre of gravity of the monitor or other element being supported on the mounting head. This reduces the magnitude of the frictional force which the bearing surfaces 15 of the motion joint must apply to the surface of the curved member 13 in order to hold its position on the hoop. As illustrated in FIGS. 11a to 11c, the motion joint 14 can also rotate relative to the curved member 13 and a combination of the movement along and about the curved member 13 means that, for example, a monitor (not shown) on the mounting head 5, can be rotated about orthogonal X'" and Y'" axes. In this application we usually refer to rotation of the motion joint about the hoop. This expression refers to relative rotation about a curved axis running down the middle of the curved member 13 and includes rotation of the motion joint with the hoop remaining still, rotation of the hoop with the motion joint remaining still and rotation of both the motion joint and hoop.

The mount fixing portion 12 is held in a turntable like portion of the monitor supporting plate 6 such that the monitor supporting plate 6 can rotate relative to the mount fixing portion 12 about axis Z" (see FIG. 1).

Figure 9:
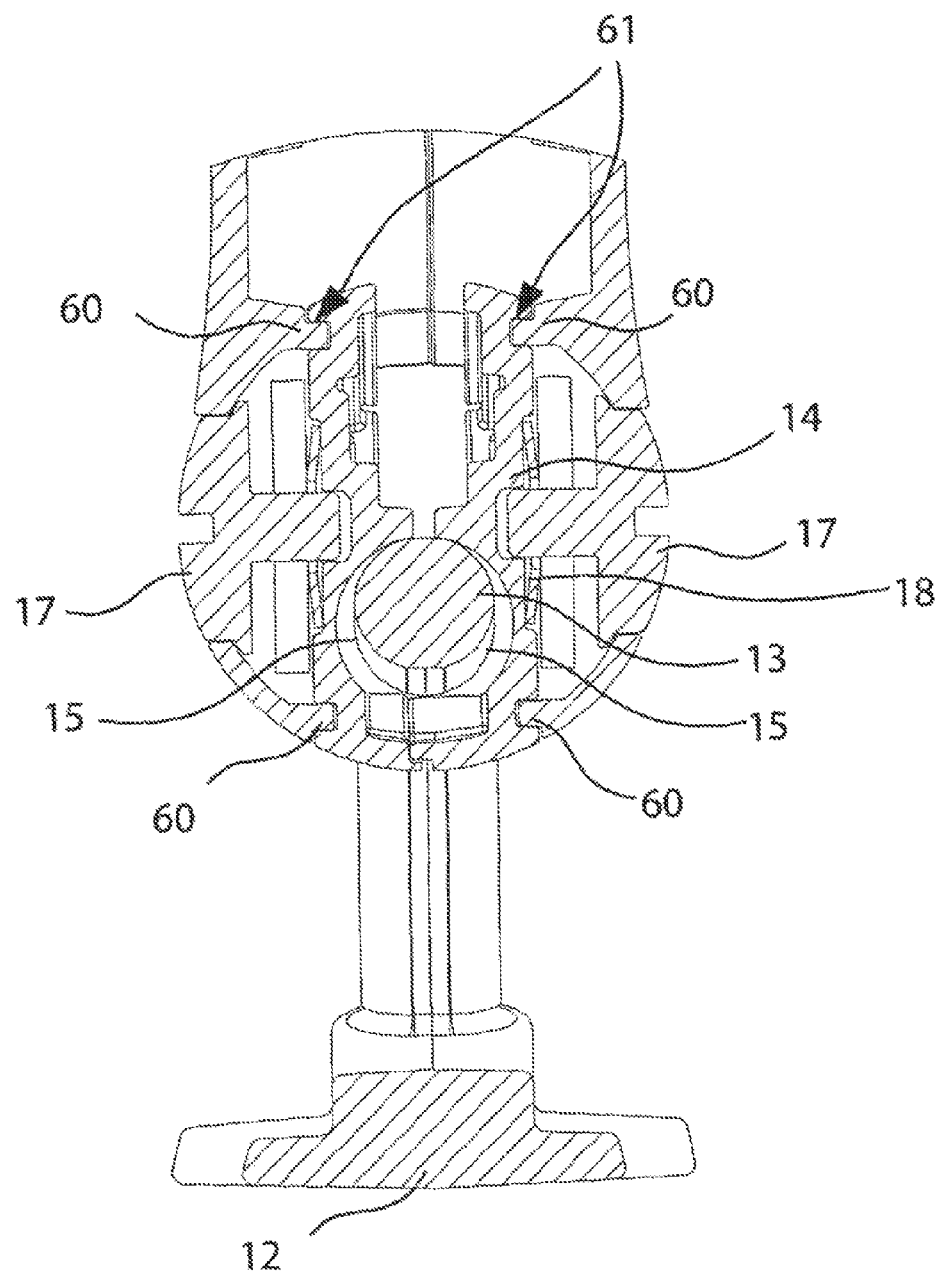
FIG. 9 is a cross-sectional view of aspects of the mounting and movement head along section IX-IX in FIG. 2.

The upper support arm 4 is a two-part metal casting whose two halves 24, 37 are held together by a screw and nut coupling 36, 22 towards the distal end of the upper support arm and a pair of proximal mid-joint button screws 23 which each pass through a pair of holes in the upper end of the mid joint 31 and engage opposite ends of the mid joint pivot pin 29 so that the upper support arm 4 can pivot about that mid joint pivot pin 29 and hence about horizontal axis X" (see FIG. 1). The distal end of each half of the upper support end casing forms the projecting portions 16 that together capture the motion joint 14 as described above (see FIGS. 8 and 9). An upper support arm front link 21 is mounted at its distal end on the distal front link pivot 19 held between the two halves 20, 39 of the motion joint 14 and at its proximal end on a proximal front link pivot pin 42 pivotally mounted on the distal end of a sliding carriageway or spring slider 43 supported within the upper arm casing. The spring slider 43 is a two-part moulding 25, 34 and the proximal front link pivot pin 42 is held between the distal ends of the two halves to support the front link 21. When the device is assembled, the slider 43 moves along the longitudinal axis L of the support arm 4 without a component of movement perpendicular thereto.

The described embodiments have the spring slider 43 inside the support arm; it could also be arranged around or alongside the upper support arm 4 provided that it moves along or parallel to the longitudinal axis L of the upper support arm 4 with no significant component of movement perpendicular thereto.

The spring slider 43 has a compression spring 35 (not shown in FIGS. 12*a* to 12*c*) inside it which engages at its distal end with a spring nut plate 40 mounted on the distal end of a force adjusting screw 30. At initial set up or final manufacture of the support device 1, the force adjustment screw is set to define a particular separation between the spring nut plate 40 and the proximal end of the spring slider 43. This defines the length of the space for the compression spring 35 and hence determines the force supplied by the spring 35. The force adjusting screw 30 can adjust the position of the spring nut plate 40 within the spring slider moulding and thereby increase or decrease the length of the compression spring and hence, respectively, decrease or increase the force that spring will apply to the spring slider and spring nut plate, and hence to the rear power link 28 pivotally connected to the proximal end of the spring slider 43 against which the proximal end of the spring 35 acts.

The rear power link 28 is arranged between the proximal end of the spring slider 43 and the mid joint 31 so as to transmit the force from the compression spring 35 to the mid joint 31. The rear power link 28 is connected to the spring slider 43 at the rear power link's distal end by a distal rear link pivot pin 44 held between the two moulding halves 25, 34 of the spring slider 43 and is connected to the mid joint 31 by a proximal rear link pivot pin 45 held between two upstanding portions 46 of the U-shaped mid joint 31. The rear power link proximal pivot 45 is located on the mid joint below the upper arm pivot point 29 and at a position forward or distal from the vertical axis passing through that support arm pivot point 29.

As will be discussed in more detail below, the combination of the support arm outer casing 47 pivotally coupled at its proximal end to the mid joint 31 and at its distal end to the motion joint 14, combined with the internal slider 43 coupled at its distal end via the front link 21 and at its proximal end via the rear power link 28 means that a monitor supported on the mounting head remains in substantially the same plane as the upper support arm 4 pivots about the mid joint 31 in the manner shown in FIGS. 12*a*, 12*b* and 12*c*.

Figure 12A:
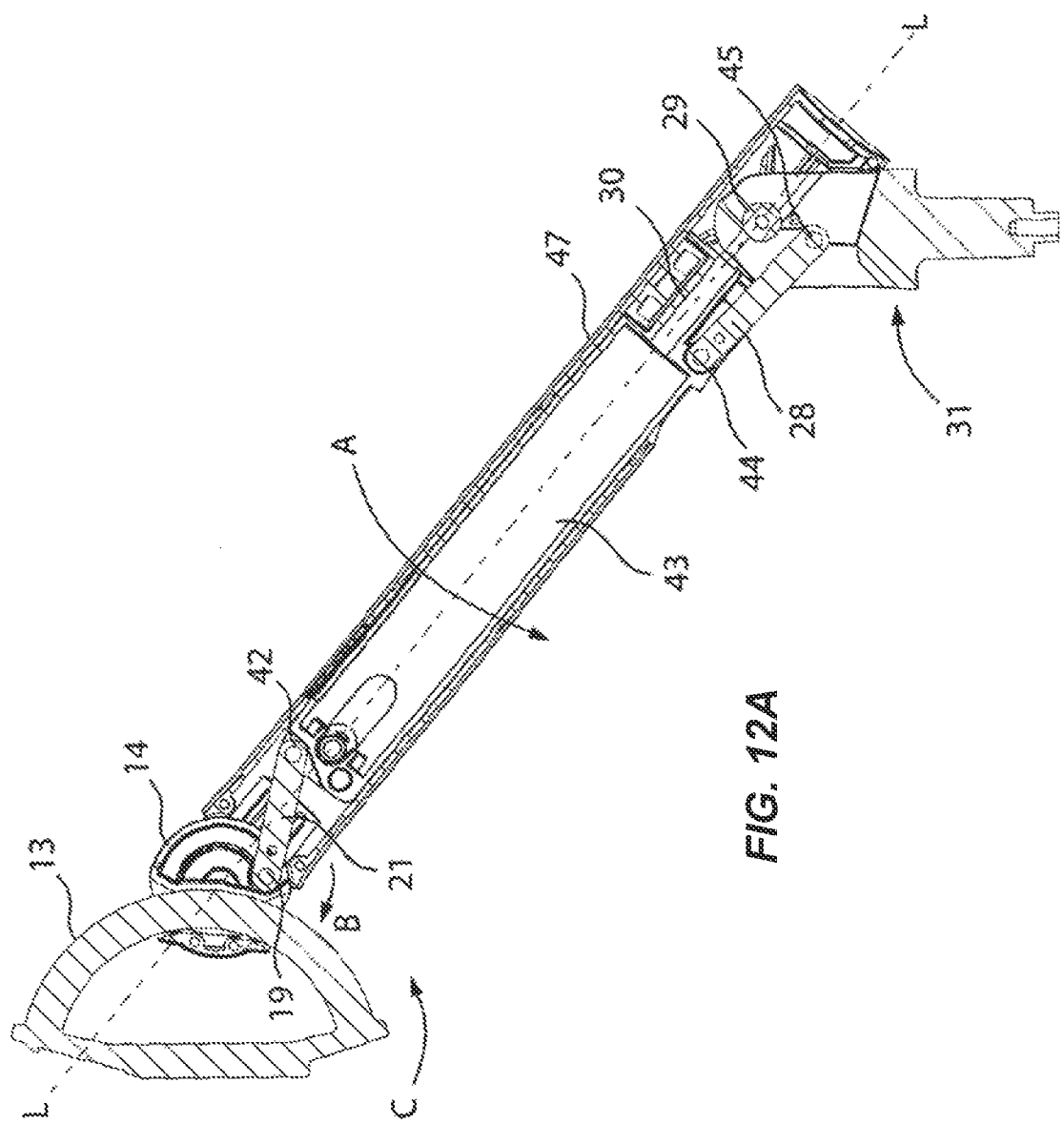
Figure 12B:
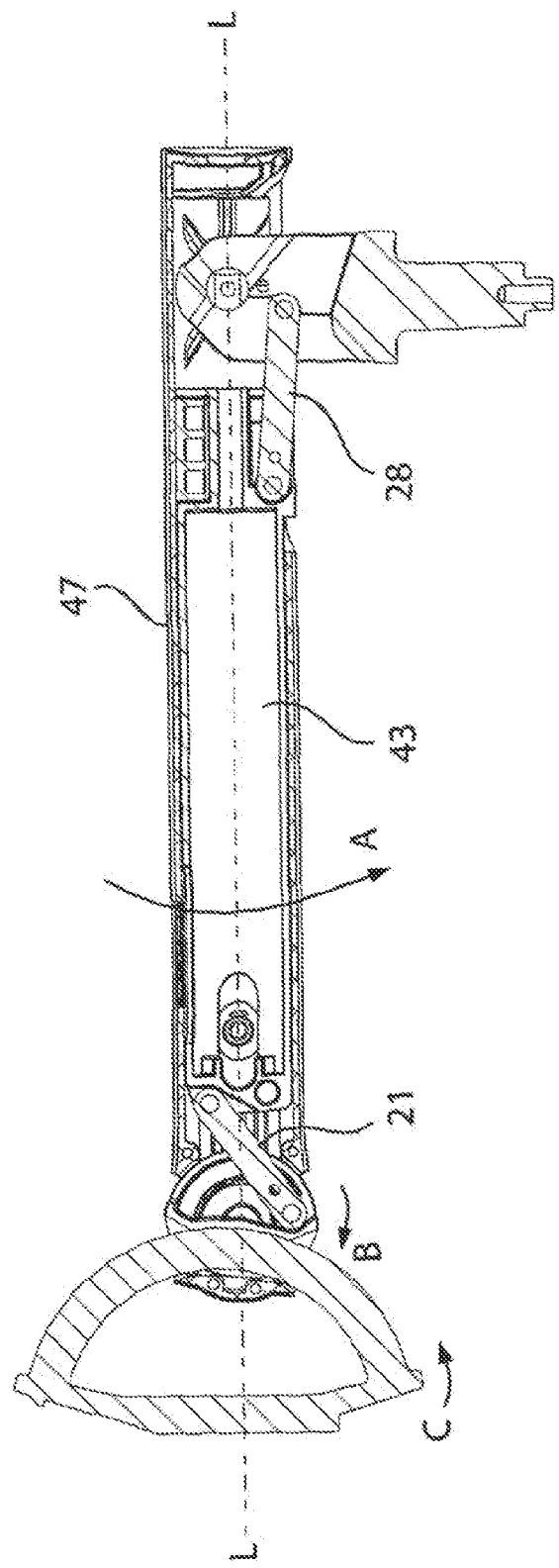

Referring to FIGS. 12*a* to 12*c*, as the upper support arm pivots about the mid joint pivot pin in direction A from, for example, the position shown in FIG. 12*a* to the position shown in FIG. 12*b* (or, for example, the position shown in FIG. 12*b* to the position in FIG. 12*c*), the rear power link 28 pushes the slider 43 in the support arm casing 47 towards the motion joint 14. This then causes the front link 21 to push its pivot point on the motion joint forward. As the distal front link pivot pin 19 is located on the motion joint 14 at a point below the pivot or axis of rotation X''' between the motion joint 14 and the support arm outer casing 47, this causes the motion joint 14 to rotate in direction B relative to the support arm casing 47 and thereby reduce or prevent tilting of the monitor relative to its original plane. If there were no movement of the motion joint in direction B relative to the support casing, a monitor held on the mounting head would tilt in direction C as the support arm was rotated in direction A.

Slider 43 can slide freely along support arm casing 47, along the centre or longitudinal axis L of the bar or force adjustment screw 30. In the illustrated embodiment, the slider 43 is inside the support arm casing 47 but it is also possible to have the slider 43 and associated links and pivots arranged outside and around the casing 47. As the upper support arm moves through its range of motion (for example, in direction A from about 40° above the horizontal, as shown in FIG. 2*a* to about 40° below the horizontal as shown in FIG. 12*c*), slider 43 slides along and relative to the arm casing 47 at a certain rate (i.e. distance along arm casing per degree of rotation). This sliding rate is defined by the geometry of the rear power link 28, the position of the proximal rear link pivot pin 45 relative to the mid joint pivot pin 29, and the position of distal rear link pivot 44 relative to the centre longitudinal axis of the bar 30. The rotation in direction B is at a defined rate (i.e. angle of rotation per measure of distance moved by slider 43 along the central axis of the arm). This rate of rotation is defined by the geometry of the front link 21, the front link distal pivot 19, the pivot X''' (see FIG. 1) and the front link proximal pivot 42 relative to the centre axis L.

Referring to FIGS. 13*a* to 13*g*, the distances or values d, z, e, g, I, n, o, offset, m, j. In length and k, d—distance between mid-joint pivot 29 and proximal force transmission link pivot 45; z—angle to vertical of the straight line between mid-joint pivot 29 and proximal force transmission link pivot 45; e—distance along perpendicular line from (longitudinal axis of support arm) to distal pivot 44 of proximal rear power link 28; g length of rear power link 28 between its respective pivots; I—distance between proximal and distal support arm pivots 29, X'''; n—component along support arm longitudinal axis between proximal pivot 42 of front link 21 and distal pivot 44 of rear power link 28; o—distance along perpendicular line from (longitudinal axis of support arm) to proximal pivot 42 of front link 21; offset—the perpendicular distance of the pivot point of the motion head from the longitudinal axis; m—the parallel distance between the pivot point of the motion head and the pivot point 19; j—length of front link 21 between its respective pivots 19, 42; In length—free spring length (i.e. length of unloaded spring); K—spring constant, are all constant as the upper support arm 4 pivots about pivot pin 29; the values of x, y, a, Spring D, p, f, B1, B2, angle C and (not shown in FIGS. 13*a* to 13*g*) Spring force W, x—angle between longitudinal axis of arm and vertical; y—angle between longitudinal axis of arm and line between the pivots of the rear power link 28; a—distance along longitudinal axis of arm between link distal pivot 44 and mid-joint pivot 29; Spring D—stressed spring length; p—distance along longitudinal axis of arm between distal link proximal pivot 44 and mounting head pivot X'''; f—parallel distance between pivot 42 and cross-section between centre line of motion joint surface 15 and vertical line motion head; B1—angle between longitudinal axis of arm and line between mounting head pivot X''' and distal link proximal pivot 43; B2—angle between line between mounting head pivot X''' and distal link proximal pivot 43, and line between mounting head pivot X''' and distal link distal pivot 19; T—tilt angle (angle between line between vertical and line between mounting head pivot X''' and distal link distal pivot 19; angle C—angle between line between mounting head pivot X''' and distal link distal pivot 19, and line between the pivots 19, 42 of the front link 21), however vary as the arm 47 rotates or pivots about pivot 29, thorough angle x.

As the slider 43 holds distal rear link pivot 44 and proximal front link pivot 42 a fixed distance or apart, pivots 42 and 44 will move at the same rate which, as discussed above, is defined by the geometry of the rear power link 28, proximal rear link pivot 45, mid joint pivot 29, distal rear link pivot 44 and the centre line through the slider 43, support arm casing 47 and axis L of the bar 30 (along which all three move relative to each other).

As pivot 42 moves forward at the defined rate set by the geometry of the various elements at the proximal end of the slider 43 and support arm casing 47, front link 21 converts this sliding action to a rotation in direct B about axis X''' (see FIGS. 1 and 12a to 12c).

As the arm 4 rotates, the aim is to keep angle T (see FIGS. 13e and 13f) constant or almost constant so that, for example, a monitor on the mounting head is at the same angle as the arm is rotated. In practice the angle T is selected so that the monitor tilts 5 degrees upwards as this allows for any tolerances/variations in the assembly of the support arm. Experience also suggests that the market perception of a monitor arm is better if the screen points up slightly rather than points down (as this gives the impression of drooping).

The inter-relationship between the various parameters illustrated in FIGS. 13a to 13g is defined by the following equations;

$$p = l - n - a \quad (1)$$

$$f = \sqrt{P^2 + (o - \text{offset})^2} \quad (2)$$

$$B1 = a\tan\left(\frac{o - \text{offset}}{p}\right) \quad (3)$$

$$\cos(B2) = \frac{m^2 + f^2 - J^2}{2mf} \quad (4)$$

$$T = x - B1 - B2 \quad (5)$$

$$\cos C = \frac{m^2 + J^2 - f^2}{2mj} \quad (6)$$

As shown in, for example, FIGS. 1, 12a, 12b and 12c, in order to raise and/or lower a monitor (not shown) fixed to the mounting head 5 relative to the lower arm 3 and hence the table surface on which the support device 1 is mounted, the upper support arm 4 can be rotated from its highest position (see FIG. 12a), approximately 45 degrees above the horizontal down to its lowest position (see FIG. 11c), approximately 45 degrees below the horizontal. The spring 35 inside the support arm 4 acts on the mid-joint 31 via the rear power link 28 to produce a torque which counter-acts the torque produced by the weight of the monitor.

As can be seen from FIG. 14, the distance of the monitor from its centre of gravity to the mid joint pivot P, is at its greatest when the upper support arm is horizontal (FIG. 14b) and at its lowest when the monitor is in either its uppermost (FIG. 14a) or lowermost (FIG. 14c) positions.

Figure 15:
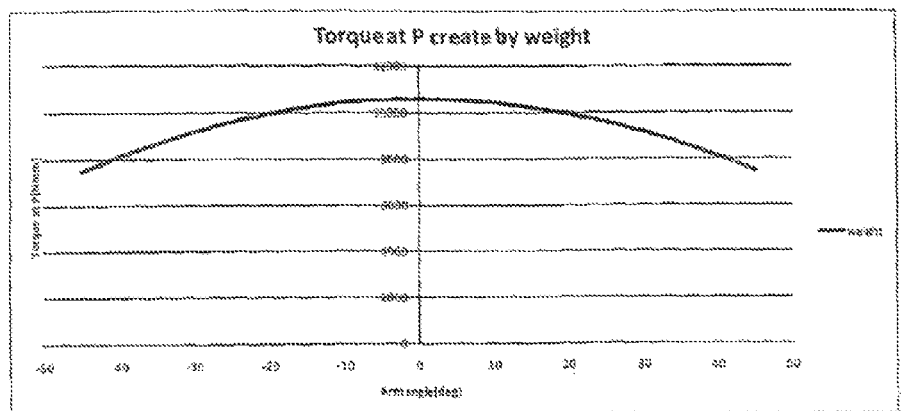
FIG. 15 illustrates the variation in torque created about the pivot on the bottom end of the upper arm of FIGS. 1 to 12 by the weight of, for example, a monitor mounted at its upper end, as the support arm pivots about that pivot at its bottom end.
Figure 16A:
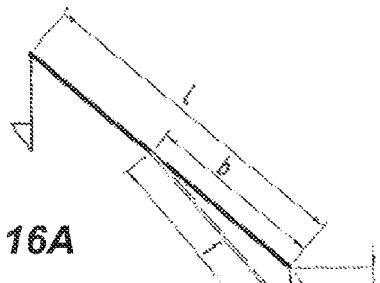
FIGS. 16a to 16c illustrate how the torque of FIGS. 13 and 14 is opposed in known support device arrangements.
Figure 16B:
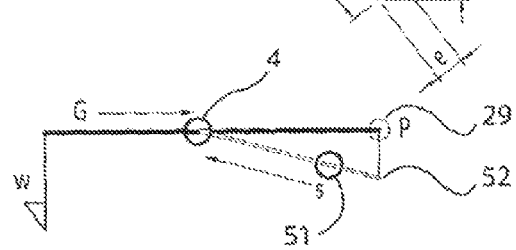
Figure 16C:
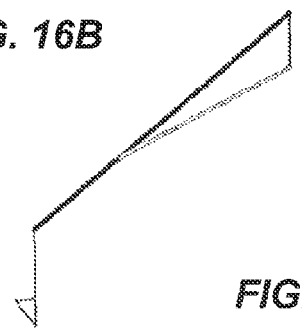

This means that (as shown in FIG. 15) the torque at the mid joint pivot 29 (P in FIGS. 14 and 16) created by the monitor weight is at a maximum when the arm angle to the horizontal is 0° and at a minimum at the ends of its range of movement which are +45° and −45° in the illustrated example. The graph of FIG. 15 is an illustration of the magnitude of the torque at P (i.e. pivot point 29) created by a monitor weight which assumes a monitor weight of 40 N, an arm length of 265 mm and a range of movement of +/−45° from the horizontal.

The known arrangements (see FIG. 16) for opposing the torque created at the pivot point 29 by the load at the distal end of the support arm use a spring force G created by either a mechanical spring or gas spring inside the upper support arm 4. This spring force G is transmitted via a rear link 51 of length f which acts through proximal rear link pivot point 52 at a distance d vertically below the main support arm pivot point P (or 29). The torque T at P generated by the spring force G is the product of the force S in the rear link 51 and the distance d. Force S is equal to the component of spring force G along the direction of the rear power link.

Figure 17:
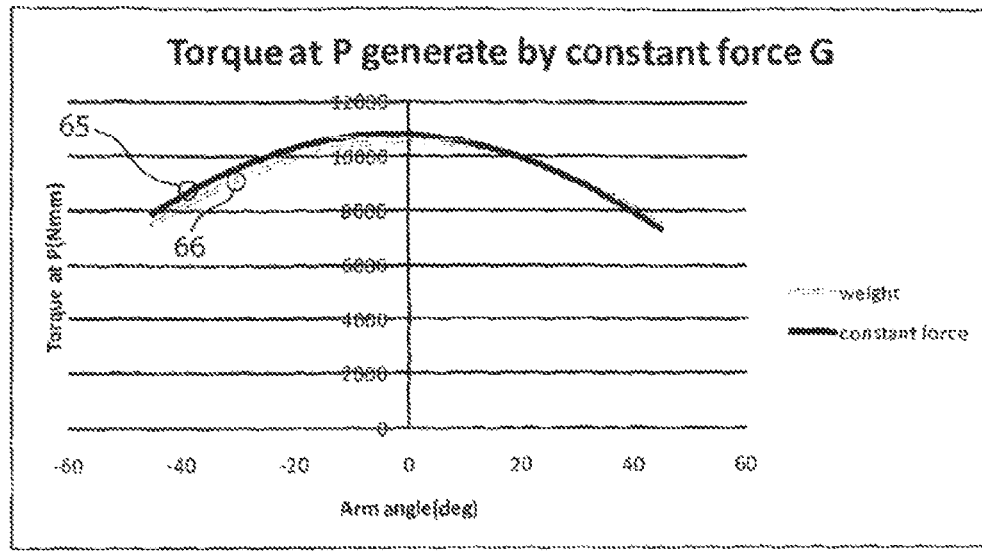
FIGS. 17 and 18 illustrate how the torque of FIGS. 13 and 14 is opposed in known support device arrangements.
Figure 18:
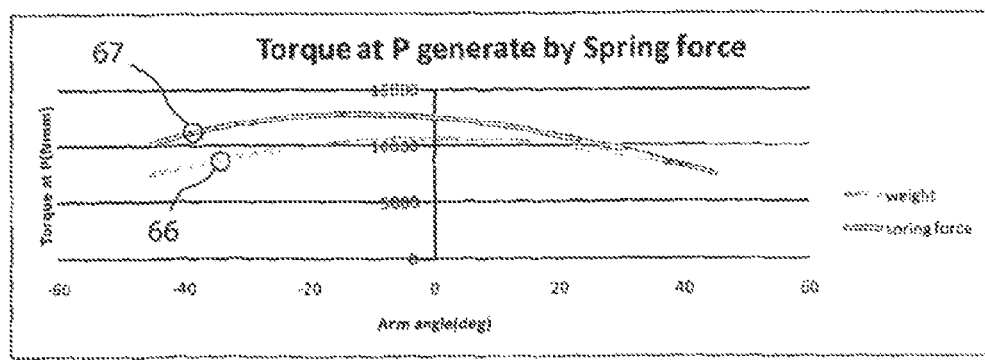

Referring to FIG. 17, if the spring force G is constant and the range of movement of the support arm is +/−45° from the horizontal, then the variation in T is as shown in FIG. 17 by the constant force line 65. The torque T varies as the support arm pivots because the component of the spring force G along the direction of the rear link 51 varies as this pivots relative to the upper support and the direction of the spring force G. As can be seen in FIG. 17, the torque created by the constant spring force in the known arrangement of FIG. 16 does not vary in the same way as the torque created by the weight of the load W (line 66 in graph). In particular, the peak weight opposing torque 62 (i.e. the torque produced by the spring force G) is not at the same position as the peak torque created by the load weight. Furthermore, if the spring force is created by a mechanical spring such as a compression spring, the differences are even greater (see FIG. 18 wherein the variation in torque from a compression spring is line 67)). This is because the magnitude of the spring force G varies as the spring is compressed to varying degrees as the upper support arm rotates.

In the embodiment of the invention shown in FIGS. 1 to 11 and 18, the torque produced by the weight of the monitor (see FIGS. 19 and 20) is opposed by a torque which is the product of the spring force created by the compression spring 35 in the rear power link 28 and the perpendicular distance e between the line of that force and the proximal power link pivot 45.

Referring to FIGS. 13a to 13g and 20a to 20c:

$$\sin y = \frac{d\sin(x+z) - e}{g} \quad (7)$$

$$a = g\cos y - d\cos(x+z) \quad (8)$$

$$\text{SpringD} = \text{setting}_n + \text{block} - a \quad (9)$$

$$\text{Spring force} = (\text{ln length} - \text{Spring } D) \cdot K \quad (10)$$

where: ln length=unstressed spring length (i.e. free/initial spring length)

Spring D=stressed spring length (this is an instantaneous value as can be taken at any point in the movement)

K=Spring constant

The torque w at the pivot 29 resulting from that spring force is then given by $$\omega = \frac{\text{Spring force} \cdot \cos y \cdot \cos(90° - x - z + y) \cdot d}{l \cdot \sin x} \quad (11)$$

The dimensions of the support arm and its associated elements, (i.e. d—distance between mid-joint pivot 29 and proximal force transmission link pivot 45; z—angle to vertical of the straight line between mid-joint pivot 29 and proximal force transmission link pivot 45; e—distance along perpendicular line from longitudinal axis of support arm to distal pivot 44 of rear power link 28; g length of rear power link 28 between its respective pivots; I—distance between proximal and distal support arm pivots 29, X'''; n—component along support arm longitudinal axis between proximal pivot 42 of front link 21 and distal pivot 44 of rear power link 28; o—distance along perpendicular line from longitudinal axis of support arm to proximal pivot 42 of front link 21; offset—the perpendicular distance of the pivot point of the motion head from the longitudinal axis; m—the parallel distance between the pivot point of the motion head and the pivot point 19; j—length of front link 21 between its respective pivots 19, 42'; In length—free spring length (i.e. length of unloaded spring); K—spring constant) are selected so as to try and best match the twin objectives of keeping angle T roughly constant through the range of motion of the support arm, and of closely matching the torques about the pivot 49 exerted by the weight of a load such as a monitor on the mounting head 5 and that exerted by the spring force through the range of motion of the support arm. Friction acts at two main points: between the slider 43 and outer casing 47 and also at the mid-joint 29. Increased spring load leads to increased friction but it is not necessary to precisely determine the exact friction levels as frication is used as an aid to provide a degree of tolerances to the functioning system.

The inventors of the subject invention have appreciated that it is possible to match the torque created by the spring force of a spring within the support arm to the torque created by a load weight without the use of a cam such as used in the prior art by careful selection of the arm geometry and that a support arm with a slider moveable along its centre axis with rear and front link pivots combined with the freedom to locate the rear link proximal pivot 45 of a point other than vertically below the support arm proximal pivot 29 allows for the selection of a geometry loading to a sufficiently close match. The inventors have appreciated that frictional forces means that a perfect match is not necessary and that the standard construction with a rear link power pivot vertically underneath the main support arm proximal pivot was sub-optimal.

The selection of the support arm geometry is done by a targeted graphical method. For a live load the torque about pivot 29 is determined for different support arm positions and plotted as a graph similar to that of FIG. 15.

The counter-balancing torque is given by equation 11. Values for each of the relevant constant (i.e. constant as the arm rotates) parameters are selected iteratively limited by the range of values of each which are possible and appropriate for the arm's function and aesthetics. Each set of those selected values is input into equations 7 to 11 for a series of different values of the angle x (and hence of other variable angles and lengths which vary as the arm rotates) to generate a graph similar to that of FIG. 21. The fixed or constant values (i.e. d—distance between mid-joint pivot 29 and proximal force transmission link pivot 45; z—angle to vertical of the straight line between mid-joint pivot 29 and proximal force transmission link pivot 45; e—distance along perpendicular line from longitudinal axis of support arm to distal pivot 44 of rear power link 28; g length of rear power link 28 between its respective pivots; I—distance between proximal and distal support arm pivots 29, X'''; n—component along support arm longitudinal axis between proximal pivot 42 of front link 21 and distal pivot 44 of rear power link 28; o—distance along perpendicular line from longitudinal axis of support arm to proximal pivot 42 of distal front link 21; offset—the perpendicular distance of the pivot point of the motion head from the longitudinal axis; m—the parallel distance between the pivot point of the motion head and the pivot point 19; j—length of distal front link 21 between its respective pivots 19, 42'; In length—free spring length (i.e. length of unloaded spring); K—spring constant) are then varied iteratively until the line on the graph of the torque generated by the spring force of FIG. 21 closely matches the line on the graph of the torque generated by the load of FIG. 15.

The illustrated embodiment of the invention has a force adjustment screw 30 which can pre-stress the spring 30 which can pre-stress the spring 35 to a different extent and thereby also affect the torque about pivot 29 resulting from the spring force. The matching exercise described above is therefore repeated for a number (say 4) of different pre-stresses which would correspond to different monitor weights or loads as a check that a selected geometry can also match different loads and degrees of appropriate pre-stressing of the spring 35.

Once a geometry which closely matches torque is achieved, equations 1 to 6 are used to plot a graph of T and the same iterative process is used to find geometry values for which T remains roughly constant during the range of movement of the arm. This may require some modification of the values determined by the first stage of iteration so it may be necessary to repeat that first process of matching torque lines or a graph until a geometry which best matches the twin requirements of constant T and matching torque w is achieved.

Figure 19A:
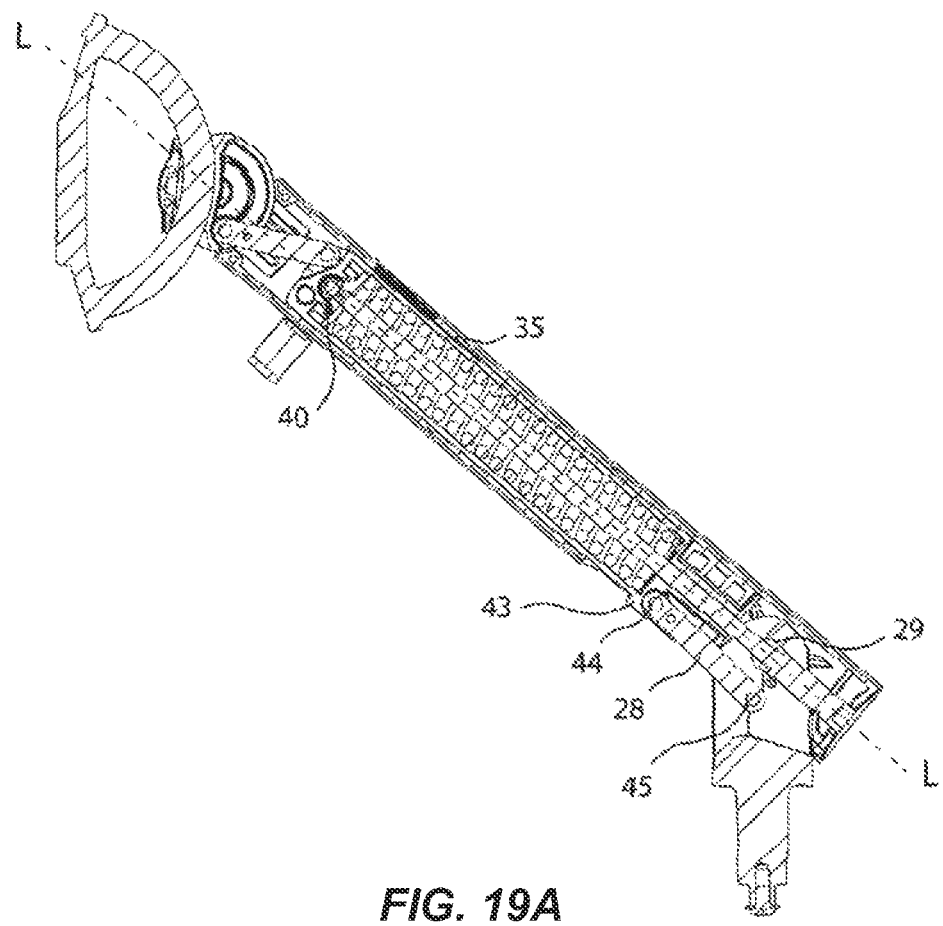
FIGS. 19a to 19c are cross-sectional views similar to those of FIGS. 12a to 12c illustrating the invention in its third aspect.
Figure 19B:
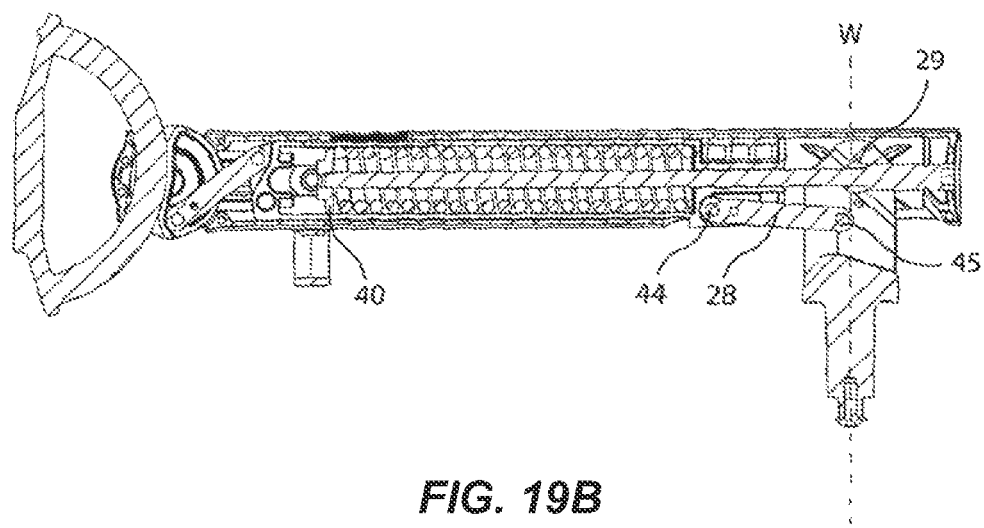
Figure 19C:
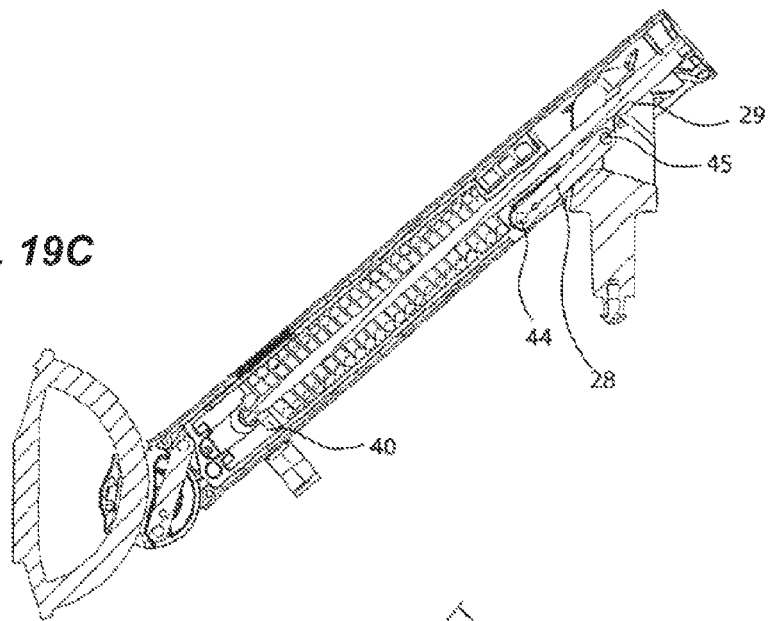
Figure 20A:
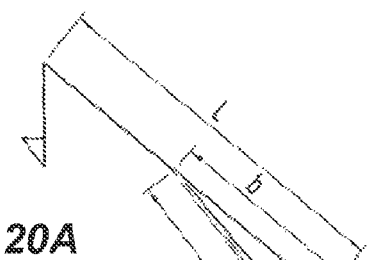
FIGS. 20a to 20c illustrate how the torque created at the pivot by the weight of a load on the lower end of the upper support arm is opposed in the arrangement of FIGS. 1 to 12, and 18.
Figure 20B:
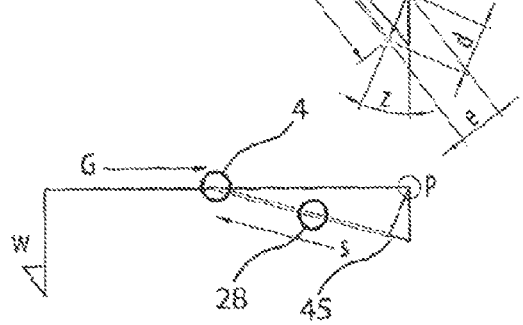
Figure 20C:
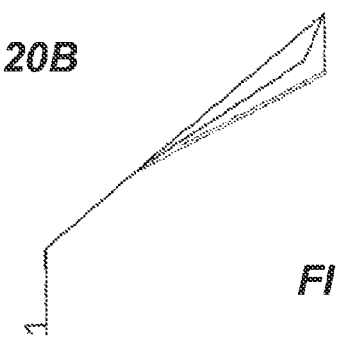

As shown in FIGS. 19a to 19c, in the described embodiment, the proximal rear power link pivot pin 44 of the described embodiment of the invention is located forward (or distal) from the axis W (see FIG. 19b) through the mid-joint pivot 29 which is orthogonal to the longitudinal axis of the upper support arm at the mid point of range of movement of the upper support arm; i.e. the proximal rear link pivot 44 is forward of a vertical axis through the mid-joint pivot 29 when the upper support arm can move between +/−45° to the horizontal. The inventors have determined that locating the rear power link pivot pin 44 forward or back from the vertical through the mid-joint pivot 29 allows for a better match of the torque exerted by the spring force about the pivot 29 to the torque exerted by the weight of a load on the mounting head 5 as the support arm moves through its range of motion.

Figure 21:
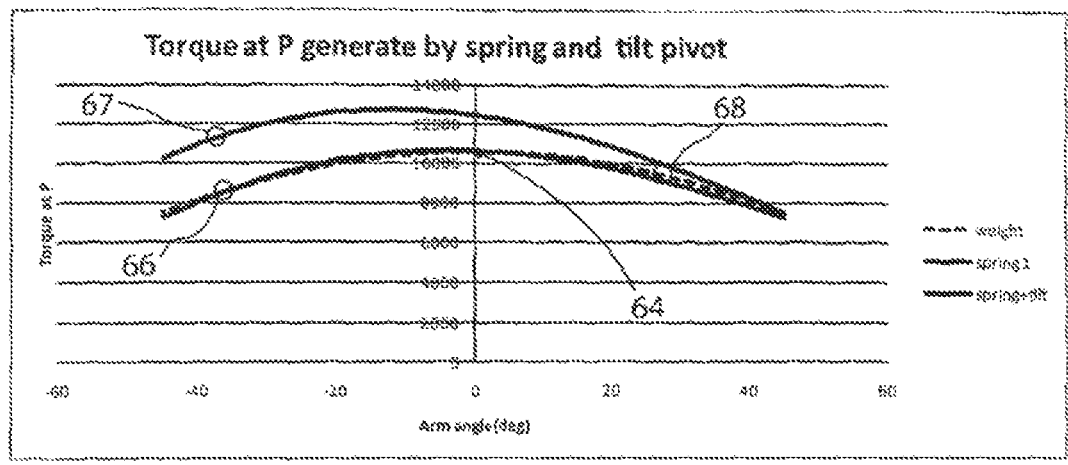
FIG. 21 illustrates how the torque created at the pivot by the weight of a load on the lower end of the upper support arm is opposed in the arrangement of FIGS. 1 to 12, and 18.

As illustrated in FIGS. 20 and 21 where line 68 illustrates the variation in torque created about the pivot pin 29 by the compression spring 35 acting via the rear power link 28, this position of the proximal rear power link pivot pin 4 moves the peak torque about mid-joint pivot 29 created by the spring 35 acting through the rear power link 28. Careful selection of the geometry and/or dimensions of the element (and their relative geometry and dimensions) making up the proximal end of the upper support arm 4 (including the rear power link 28; pivots 29, 44, 45), the spring properties and the load weight allow one to move the position of peak opposing torque 64 (see FIG. 21) to a position closer to the position of the peak load weight torque of line 66.

The placing of the proximal pivot 45 for the rear link at a position forward or distal from the vertical line through the proximal support arm pivot 29 (i.e. forward or distal from the line or axis along which gravity acts means that the perpendicular distance e varies in a manner which is closer to the variation in the torque caused by the weight of the monitor than is the case in the known arrangements which have the rear link pivot point in line with a vertical line through the proximal support arm pivot.

Referring to FIGS. 19a to 19c, as the support arm 4 rotates from its uppermost position (see FIG. 19a), through the mid-position (see FIG. 19b) down to its lowermost position (19c), the rear power link 28 progressively compresses the spring 35 by pushing it against the fixed spring nut plate 40. This means that the force provided by the spring 35 progressively increases as the support arm 4 is lowered in a manner similar to that discussed above in connection with FIG. 18.

Figure 22:
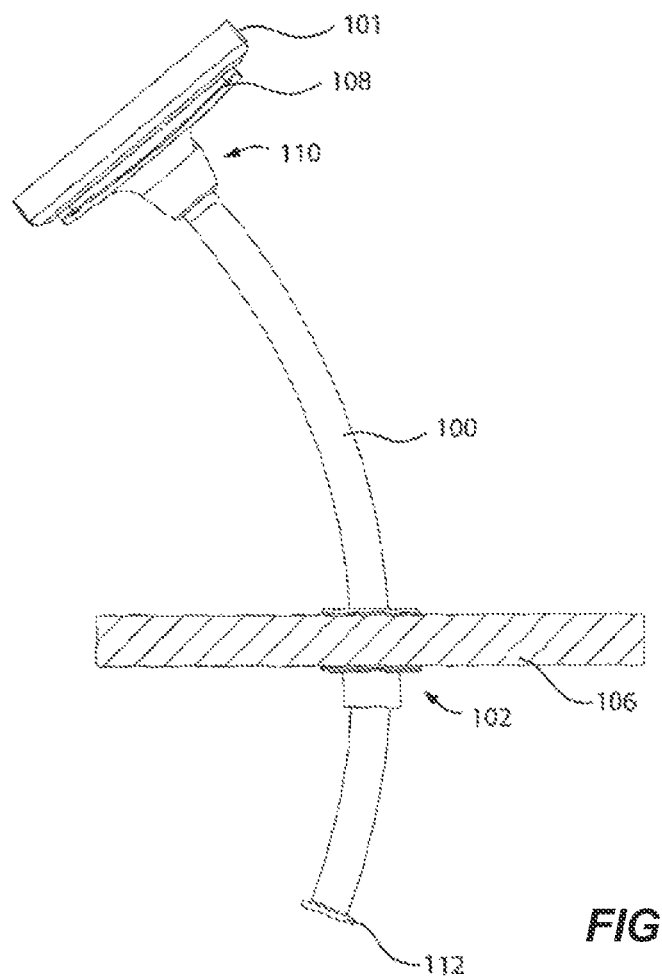
FIG. 22 is a schematic side view of a further embodiment of a support system in accordance with the invention.
Figure 23:
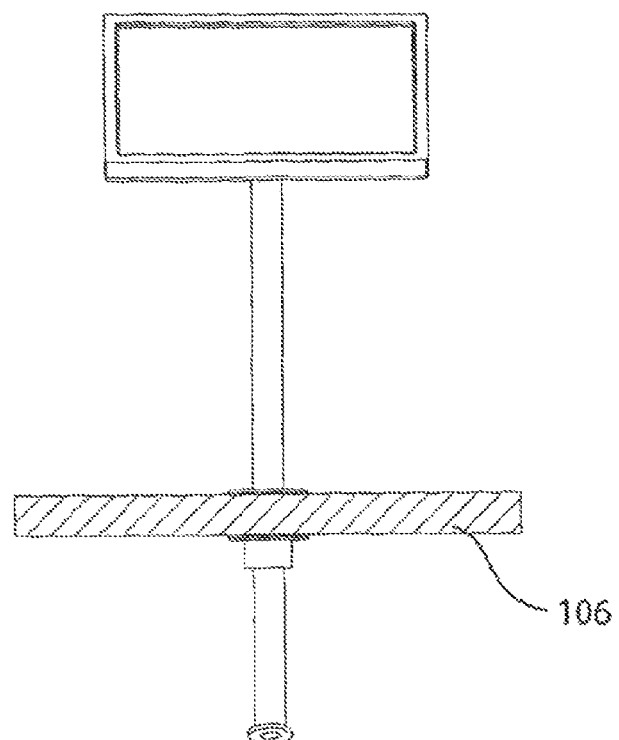
FIG. 23 shows the support system of FIG. 22 from the front.
Figure 24:
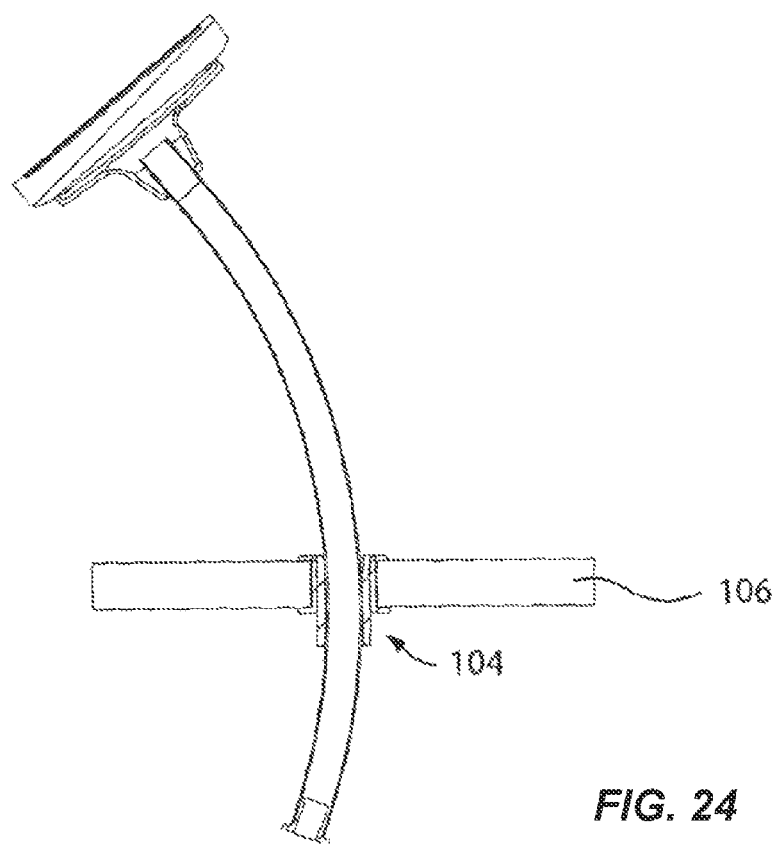
FIG. 24 is a schematic side cross-sectional view of the devices of FIGS. 22 and 23.

A further embodiment is shown in FIGS. 22-24 of the drawings.

Whilst it is usual to mount the display device on a support arm, there are some situations in which it may be desirable for the display device to be stored flat against, or in a recess so that it flush with, a surface such as a wall or table-top when it is out of use, but to be movable away from the surface to a more comfortable position for viewing when in use. A support system utilising the invention intended for these circumstance is shown schematically in FIGS. 22 to 24.

The embodiment of FIGS. 22 to 24 differs from those described above in that the support arm and hoop element are replaced by a single curved arm 100 which is of circular cross-section along its entire operative length. The curved arm 100 cooperates with a motion joint 102 generally similar to motion joint 14 described above.

The internal features of motion joint 102, in particular, the internal bearing surface which engages the external surface of the curved arm 100, are the same as those of motion joint 14, but the external casing 104 of the motion joint 102 is designed to allow it to be mounted securely in a through opening formed in, as shown in the drawings, a generally horizontal surface such as a tabletop 106. For example, the outer casing 104 may be formed in two parts, each provided with an outwardly-extending annular flange, so that when the two parts of the casing 104 are secured together, the margin of the tabletop 106 around the through opening is trapped between the flanges to secure the casing 104 in the through opening. Alternatively, the casing 104 may be secured by other means such as gluing.

Although FIGS. 22 to 24 show the support system being used to mount a display device 101 relative to a generally horizontal surface, it will be understood that a similar arrangement may be used in respect of generally vertical surfaces such as walls or, indeed, in relation to inclined surfaces.

The display device 101 is secured to the curved arm 100 by means of a suitable mounting plate 108. Whilst this may serve simply to hold the display device 101 on the end of the curved arm 100 in a fixed position, the mounting plate 108 preferably includes a bearing 110 so that the display device 101 can be rotated at will about the end of the circular-section curved arm 100. This not only allows fine adjustment of the viewing position of the display device 101 in use but also facilitates stowing of the display device 101 neatly against the tabletop 106 or in a recess, where one is provided, when it is no longer needed.

The end of the curved arm 100 remote from the display device 101 is provided with an end cap 112 of larger diameter than the curved arm 100 which acts as a stop to prevent the curved arm 100 being drawn all the way through and removed from the motion joint 102.

In use, the curved arm 100 can be moved through the motion joint 102, overcoming the friction exerted by the internal bearing surface, until the display device 101 is a suitable distance from the surface of the tabletop 106. The frictional engagement of the internal bearing surface with the cylindrical surface of the curved arm 100 will then prevent the arm 100 sliding back through the motion joint 102. The position and orientation of the display device can then be adjusted further either by rotation of the curved arm 100 about its axis within the internal bearing surface of the motion joint 102 or by rotation mounting plate 108 of the display device 101 about the central axis of the end of the curved arm 100, or both.

When the display device is no longer needed, it can simply be returned to its original position against, or housed in a recess formed in, the tabletop 106. The curved arm 100 can be hollow so that cables can be fed through it.

The invention claimed is:

1. A support system for supporting a load comprising:
    a mounting head for a load;
    a base element;
    a support arm having a first support arm pivot coupling a proximal portion of the support arm to the base element and a second support arm pivot coupling a distal portion of the support arm to the mounting head;
    a slider movable along the longitudinal axis of the support arm;
    a first link pivotally connected to a proximal portion of the slider and pivotally connected to the base element, a first proximal pivot coupling the first link to the base element and a first distal pivot coupling the first link to the slider; and
    a second link pivotally connected to a distal portion of the slider and the mounting head, a second distal pivot coupling a distal portion of the slider to the mounting head and a second proximal pivot coupling the second link to the slider, wherein the slider holds the distance between the first distal pivot and the second proximal pivot constant.

2. A support system according to claim 1 wherein the slider is disposed within the support arm.

3. A support system according to claim 1 wherein the slider is disposed adjacent or alongside the support arm.

4. A support system according to claim 1 wherein the first proximal pivot is below the first support arm pivot and the second distal pivot is below the second support arm pivot.

5. A support system according to claim 1 further including a biasing element within the slider and generating a biasing force against an end of the slider.

6. The support system of claim 5, wherein the biasing element is a compression spring.

7. A slider assembly for a support arm comprising:
    an arm pivotally connected to a base at a proximal end via a proximal pivot coupling and pivotally connected to a mounting head at a distal end via a distal pivot coupling, a longitudinal axis of the support arm extending through the proximal pivot coupling and the distal pivot coupling;
    a slider slidable along the longitudinal axis;
    a rear link interconnected between the slider and the base and moving the slider with respect to the arm as a function of an angle of the arm with respect to horizontal; and
    a front link interconnected between the slider and the mounting head to adjust an angle of the mounting head with respect to vertical as a function of the angle of the arm with respect to horizontal; and
    a biasing element interconnected with the slider such that a biasing force generated by the biasing element is a function of the position of the slider within the arm, the biasing force being transmitted through the rear link to generate a torque at least partially offsetting a torque arising from the load,
    wherein the rear link is pivotally attached at one end to the base below the longitudinal axis and is pivotally attached at an opposite end to the slider below the longitudinal axis, and wherein the front link is pivotally attached at one end to the slider above the longitudinal axis and is pivotally attached at an opposite end to the mounting head below the longitudinal axis.

8. The slider assembly of claim 7, wherein the slider and biasing element are inside the arm.

9. The support device of claim 7, further comprising a motion joint interconnected between the arm and the mounting head, and defining the distal pivot coupling, wherein the front link is interconnected between the slider and the motion joint.

10. A support device for a load comprising:
a lower arm;
an upper arm;
a mid-joint interconnecting the lower arm and upper arm for relative movement;
a mounting head connected to the upper arm and adapted to connect to a load to be supported, a weight of the load applying a load torque to the upper arm about the mid-joint as a function of an angle of the upper arm with respect to horizontal, wherein the mounting head includes a motion joint interconnected to the upper arm and adapted to connect to the load, the motion joint permitting pivoting of the load with respect to the upper arm;
a slider supported by the upper arm;
a power link interconnecting the mid-joint and the slider to move the slider with respect to the upper arm as a function of an angle of the upper arm with respect to horizontal;
a front link interconnecting the motion joint and the slider, the front link setting an angle of tilt of the motion joint with respect to vertical as a function of the position of the slider with respect to the upper arm; wherein movement of the slider under the influence of the power link during movement of the upper arm causes the front link to maintain a substantially constant angle of tilt through a range of motion of the upper arm; and
a biasing member applying a biasing force to the slider as a function of the position of the slider with respect to the upper arm,
wherein the biasing force acts through the power link to generate an offsetting torque at the mid-joint acting at least partially in a direction opposite to the load torque, and the upper arm defines a longitudinal axis and wherein one end of the front link is above the longitudinal axis and an opposite end of the front link is below the longitudinal axis.

11. The support device of claim 10, wherein the upper arm includes a range of pivotal motion from approximately 45 degrees above horizontal to approximately 45 degrees below horizontal.

12. The support device of claim 10, wherein the upper arm pivots about a pivot axis in the mid-joint; and wherein the power link is pivotally connected to the mid-joint at a point spaced from the pivot axis.

13. The support device of claim 12, wherein the power link is pivotally connected to the mid-joint below the pivot axis.

14. The support device of claim 10, wherein the slider and biasing member are housed within the upper arm.

15. The support device of claim 10, wherein the upper arm defines a longitudinal axis and wherein the slider is supported by the upper arm for movement parallel to the longitudinal axis.

* * * * *